(12) United States Patent
Arya et al.

(10) Patent No.: US 11,551,492 B2
(45) Date of Patent: *Jan. 10, 2023

(54) DATA LOGGING IN AERIAL PLATFORM

(71) Applicant: GoPro, Inc., San Mateo, CA (US)

(72) Inventors: Ashwani Arya, Encinitas, CA (US); Gary Fong, Cupertino, CA (US)

(73) Assignee: GoPro, Inc., San Mateo, CA (US)

( * ) Notice: Subject to any disclaimer, the term of this patent is extended or adjusted under 35 U.S.C. 154(b) by 221 days.

This patent is subject to a terminal disclaimer.

(21) Appl. No.: 16/852,759

(22) Filed: Apr. 20, 2020

(65) Prior Publication Data
US 2020/0250903 A1    Aug. 6, 2020

Related U.S. Application Data

(63) Continuation of application No. 15/490,876, filed on Apr. 18, 2017, now Pat. No. 10,643,406.
(Continued)

(51) Int. Cl.
*G07C 5/08* (2006.01)
*G04R 20/02* (2013.01)
(Continued)

(52) U.S. Cl.
CPC ............ *G07C 5/085* (2013.01); *B64C 39/024* (2013.01); *B64D 47/08* (2013.01); *G01R 31/382* (2019.01); *G04R 20/02* (2013.01); *G06V 20/13* (2022.01); *G07C 5/008* (2013.01); *H04L 1/00* (2013.01); *H04L 43/0811* (2013.01); *H04L 67/143* (2013.01); *H04L 67/568* (2022.05); *H04L 69/14* (2013.01); *H04L 69/16* (2013.01); *H04L 69/161* (2013.01); *H04L 69/40* (2013.01); *H04N 7/181* (2013.01); *H04W 4/38* (2018.02); *B64C 2201/024* (2013.01); *B64C 2201/027* (2013.01); *B64C 2201/127* (2013.01); *B64C 2201/146* (2013.01); *H04L 67/12* (2013.01); *H04N 7/185* (2013.01)

(58) Field of Classification Search
CPC .................. G07C 5/085; H04W 4/38
See application file for complete search history.

(56) References Cited

U.S. PATENT DOCUMENTS 9,214,045 B1 * 12/2015 Strauss .................. G07C 5/085
10,099,785 B1 * 10/2018 Gonzalez .............. B64C 39/024
(Continued)

*Primary Examiner* — Jess Whittington
(74) *Attorney, Agent, or Firm* — Young Basile Hanlon & MacFarlane, P.C.

(57) ABSTRACT

An unmanned aerial vehicle manages storage of data and transfer between other connected devices. The unmanned aerial vehicle captures sensor data from sensors on the unmanned aerial vehicle. The unmanned aerial vehicle transfers the captured sensor data from the unmanned aerial vehicle to a remote controller via a wireless interface. The captured data may be transferred via a TCP link, a UDP link, or a combination thereof. If a loss of link is detected, the captured sensor data is stored to a buffer and a battery level of the unmanned aerial vehicle and a flight status of the unmanned aerial vehicle is monitored. The stored sensor data is transferred from the buffer to a non-volatile storage responsive to the battery level dropping below a predefined threshold or detecting that the unmanned aerial vehicle is stationary and a shutdown may be imminent.

20 Claims, 18 Drawing Sheets

Related U.S. Application Data

(60) Provisional application No. 62/325,429, filed on Apr. 20, 2016.

(51) Int. Cl.
| | |
|---|---|
| *B64C 39/02* | (2006.01) |
| *B64D 47/08* | (2006.01) |
| *G07C 5/00* | (2006.01) |
| *H04N 7/18* | (2006.01) |
| *H04L 69/16* | (2022.01) |
| *G01R 31/382* | (2019.01) |
| *H04L 43/0811* | (2022.01) |
| *H04L 1/00* | (2006.01) |
| *H04L 69/40* | (2022.01) |
| *H04L 69/14* | (2022.01) |
| *H04W 4/38* | (2018.01) |
| *H04L 67/143* | (2022.01) |
| *G06V 20/13* | (2022.01) |
| *H04L 67/568* | (2022.01) |
| *H04L 67/12* | (2022.01) |

(56) References Cited

U.S. PATENT DOCUMENTS

| | | | |
|---|---|---|---|
| 2016/0232795 A1* | 8/2016 | Thiele | G05D 1/0022 |
| 2017/0084094 A1* | 3/2017 | Worden | G07C 5/0808 |
| 2017/0085253 A1* | 3/2017 | Cao | H03K 3/012 |
| 2017/0243412 A1* | 8/2017 | Deville | G06F 11/3013 |
| 2018/0218619 A1* | 8/2018 | Brown | G08G 5/0069 |
| 2018/0279105 A1* | 9/2018 | Huber | H04W 48/12 |

* cited by examiner

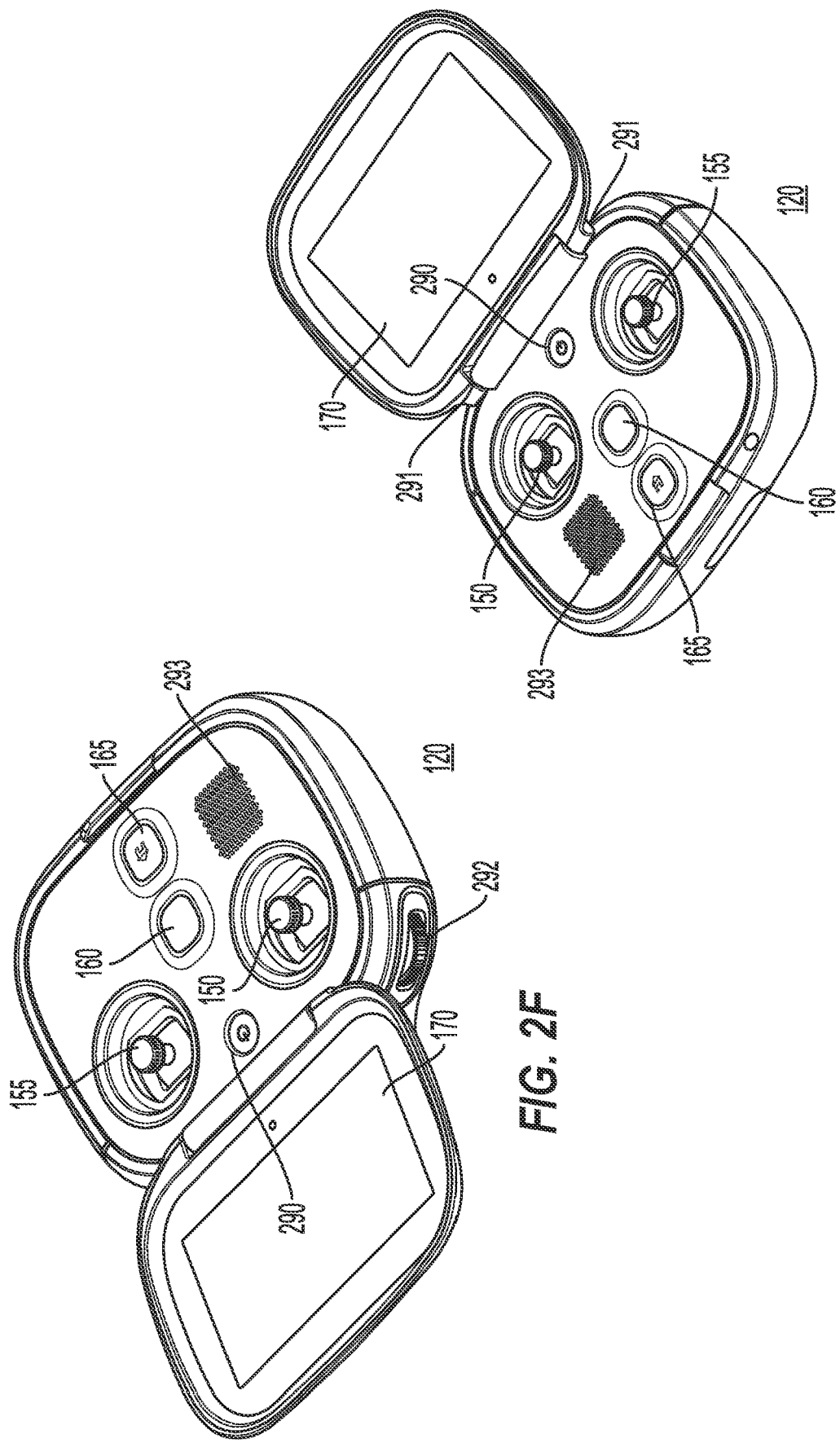

DATA LOGGING IN AERIAL PLATFORM

CROSS REFERENCE TO RELATED APPLICATIONS

This application is a continuation of U.S. patent application Ser. No. 15/490,876, filed Apr. 18, 2017, which claims the benefit of U.S. Provisional Application No. 62/325,429, filed Apr. 20, 2016, the contents of which are incorporated by reference herein.

BACKGROUND

The disclosure generally relates to unmanned aerial vehicles, for example, unmanned aerial vehicles with cameras.

Remote controlled devices with image capture devices, e.g., cameras mounted upon those devices, are known. For example, a remote control road vehicle can be configured to mount a camera on it to capture images as the vehicle is moved about remotely by a user. Similarly, remote controlled aerial vehicles, e.g., drones or quadcopters, have been mounted with cameras to capture aerial images through the camera as a user remotely controls the vehicle.

BRIEF DESCRIPTION OF THE DRAWINGS

The disclosed embodiments have advantages and features which will be more readily apparent from the detailed description, the appended claims, and the accompanying figures (or drawings). A brief introduction of the figures is below.

FIG. 2F illustrates a first perspective view of a controller for an aerial vehicle in an open configuration.

FIG. 2G illustrates a second perspective view of a controller for an aerial vehicle in an open configuration.

DETAILED DESCRIPTION

Figure 1:
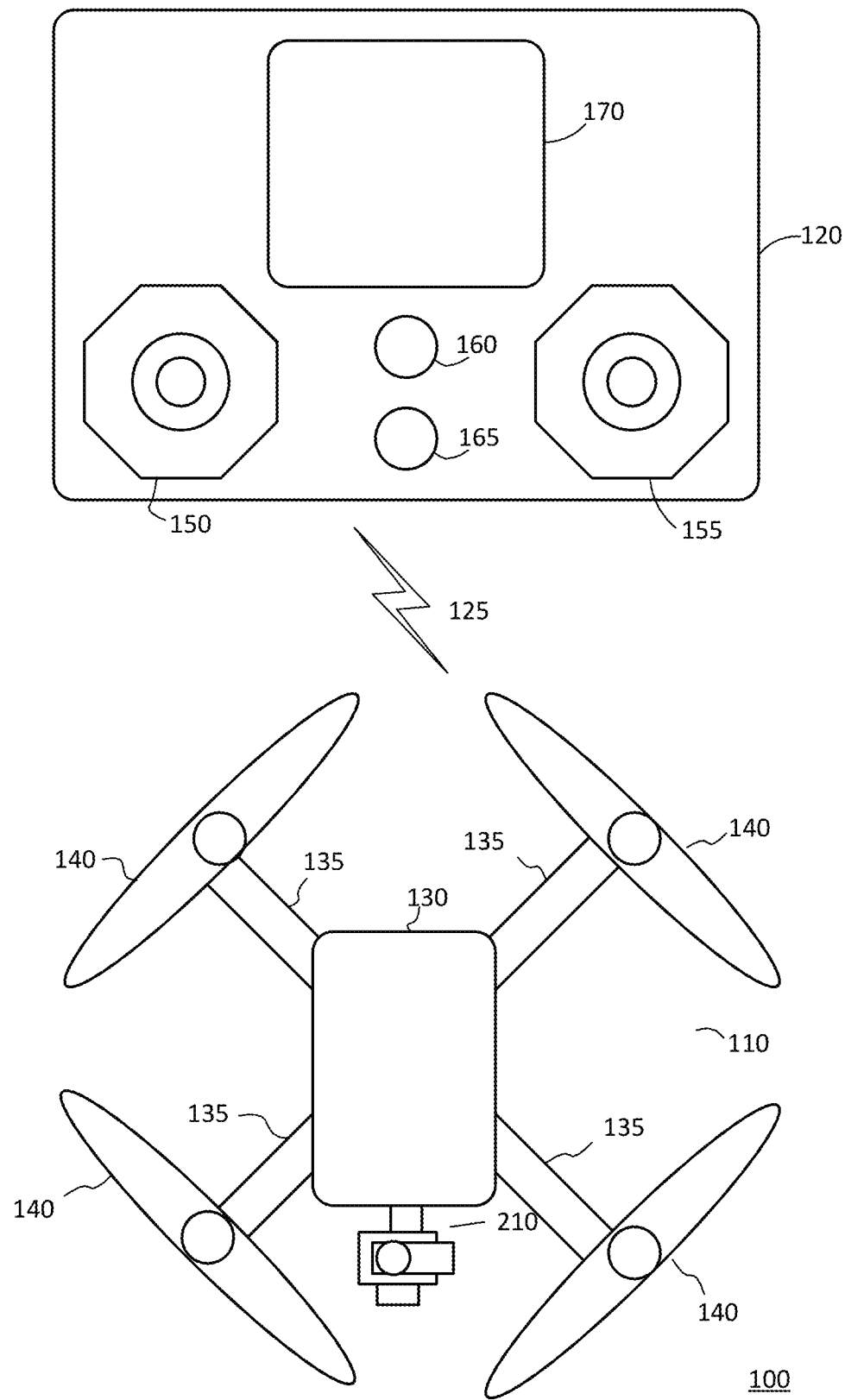
FIG. 1 is an example embodiment of an aerial vehicle system.

The Figures (FIGS.) and the following description relate to embodiments by way of illustration only. It should be noted that from the following discussion, alternative embodiments of the structures and methods disclosed herein will be readily recognized as viable alternatives that may be employed without departing from the principles of what is claimed.

Reference will now be made in detail to several embodiments, examples of which are illustrated in the accompanying figures. It is noted that wherever practicable similar or like reference numbers may be used in the figures and may indicate similar or like functionality. The figures depict embodiments of the disclosed system (or method) for purposes of illustration only. One skilled in the art will readily recognize from the following description that alternative embodiments of the structures and methods illustrated herein may be employed without departing from the principles described herein.

Configuration Overview

A data logging system manages data in an aerial vehicle system. Timed sensor data and system state information may be captured by the aerial vehicle and transferred to a remote controller via a wireless interface. When a loss of a link is detected, captured sensor data and the system state information are stored to a buffer (e.g., a volatile memory) and a battery level of the aerial vehicle is monitored. The stored sensor data and the system state information may be transferred from the buffer to a non-volatile storage responsive to the battery level dropping below a predefined threshold, thus saving write cycles of the non-volatile memory absent imminent data loss. If the link is re-established the buffer data may be downloaded to the remote controller. The previously stored data from the non-volatile memory may also be transferred to the remote controller.

A flight status of the unmanned aerial vehicle may also be monitored when the link loss occurs to determine whether the aerial vehicle is in motion or stationary. If the aerial vehicle determines that it is stationary when the link loss occurs, this may be indicative of a crash. To preserve data in this situation, the sensor data stored to the buffer may be transferred to the non-volatile storage responsive to detecting that the unmanned aerial vehicle is stationary following the loss of the link. On the other hand, if the aerial vehicle remains in motion following the loss of the link, the sensor data may be stored to the buffer until the buffer is full. Once the buffer is full of untransferred data, the data may be written to the non-volatile storage.

When communicating data over the link to the remote controller, an available bandwidth for transferring data may be determined. Based on the available bandwidth and network conditions, a wireless interface for transferring a data packet to a remote controller may be selected from an available TCP interface and a UDP interface and the data packet transmitted over the selected link. If the bandwidth exceeds an available threshold, the data packet may be transferred in duplicate over bot the TCP and the UDP interface. If less bandwidth is available, the UDP interface may be given preference and the data packet transmitted only over the UDP link. When the link condition improves, TCP data may be sent at a faster rate to catch up for the time it was not transmitted. The rate of transmission is determined in a way that does not impact transmission of control data or real-time video data provided to the remote controller. In an embodiment, a logging format may incorporate events arising from the aerial vehicle platform, a gimbal, and a camera subsystem. The log format may be enable additional events and sensor data to be added at any sampling frequency and for additional parameters to be added with firmware updates. In one embodiment, the data generated by the aerial vehicle may be signed and encrypted to avoid tampering of the logged events.

Aerial Vehicle Platform

Disclosed by way of example embodiments is an aerial capture platform. The aerial capture platform can include a remote controlled (or unmanned) aerial vehicle coupled with a camera and may include a remote controller. The aerial vehicle may be remotely controlled through a remote controller. The camera further may be coupled with a mounting configuration.

Remote controlled aerial vehicles are unmanned aerial vehicles and sometimes referred to as consumer drones or simply, "drones". The remote controlled aerial vehicle can be directly and immediately controlled for flight. For example, the aerial vehicle may be operated remotely from a remote controller. Remote controlled aerial vehicles also may include unmanned aerial vehicles that may be pre-programmed for flight (e.g., a pre-flight route (or path) as further described herein), but for which no control, or very limited control, may be necessary via a remote controller during flight. Such configurations may be referred to as autopilot. Examples of limited control may be a manual override or a flight adjustment to the pre-programmed flight. For ease of discussion of remote controlled aerial vehicle or aerial vehicle will be used to refer to these and other instances of unmanned aerial vehicle flights.

The aerial vehicle may include a mounting configuration that couples with a camera and can secure it. The mounting configuration can be removably attachable. The mounting configuration may include a gimbal to couple with the camera, which can assist with stabilization for image capture. Moreover, the camera can be configured so that it may be removably attachable from the mounting configuration and structured to operate as a standalone camera. The camera and mounting configuration may also be compatible with other mounting solutions, for example, a handheld (or portable) handle, pole or sports board mount. In some example embodiments, the aerial vehicle may include an integrated camera. The integrated camera also may include a gimbal assembly.

As disclosed herein the aerial capture platform is designed and configured to capture images, from an aerial vehicle perspective. For ease of discussion, reference herein will be made to images but it should be understood that such reference to images may include any media, e.g., video, still images, and/or audio, without limitation. The aerial capture platform configuration allows for a content creation platform that can be integrated with other camera and camera-related systems and ecosystems, such as activity cameras and their ecosystems.

In addition, the aerial capture platform as disclosed herein is configured so that it may be content-focused image capture where the images are captured without the user physically holding a camera. For example, the user may generate stable content from high above the ground or water.

The aerial capture platform as further described herein may be configured to provide ease of use so that the aerial vehicle can be flown within a relatively short time (e.g., minutes) of being unpacked. The aerial capture platform may be configured with mechanical structures that are easy to position and include intuitive hardware and software interfaces.

The aerial vehicle itself is portable. Portability is achieved through removable components, e.g., propellers, arms, landing gear, battery and/or size reduction features such as folding arms, folding landing gear and internal to the housing antenna system. These features allow the aerial vehicle and corresponding components of the aerial capture platform to be structured for storage within a compact case or enclosure having a volume of, for example, 20 liters to 30 liters.

The remote controller of the aerial capture platform can be configured for use in operating the aerial vehicle. The remote controller can be a dedicated mobile computing device or another mobile computing device, for example, a smartphone, a tablet, or notebook computer. By way of example, a dedicated remote controller can be configured to include a visual screen (e.g., liquid crystal display or plasma). In addition, the remote controller can include mechanical and/or solid state control elements, e.g. a joystick, touchpad, etc. The remote controller itself can be portable and contained within a casing (or housing). An antenna system can be configured within the casing of the remote controller to further enhance portability. The remote controller can be primarily dedicated for use with the aerial vehicle and can include its own operating system (e.g., an ANDROID based OS).

Example System Configuration

The descriptions herein are in the context of a remote controlled aerial vehicle 110, for example, a rotary wing or fixed wing aircraft. However, some disclosed configurations may apply to other remote controlled vehicles such as boats and cars. In addition, the remote controlled vehicles may be hobby sized form factors. As noted above remote control aerial vehicles may sometimes be referred to as unmanned aerial vehicles or consumer drones and in this context may include camera units/hardware for capturing images.

Turning now to Figure (FIG. 1, it illustrates an example platform (or system) 100 of a remote controlled aerial vehicle 110 in communication with a remote controller 120. The platform 100 can include a remote controlled aerial vehicle 110 and a remote controller 120. The aerial vehicle 110 and the remote controller 120 are communicatively coupled through a wireless link 125. The wireless link 125 can be a Wi-Fi link, cellular (e.g., long term evolution (LTE), 3G, 4G, 5G) or other wireless communication link. In this example of the platform 100, the aerial vehicle 110 can be, for example, a quadcopter or other multirotor helicopter. Also in this example, the remote controller 120 is illustrated as a dedicated remote controller, but the principles described herein apply to other devices that may operate as a remote controller, for example, a smartphone, tablet, a laptop, etc.

The aerial vehicle 110 in this example includes a housing (or body) 130, a gimbal assembly 210, two or more arms 135, and two or more propellers 140. The housing 130 has one or more cavities for a payload. The payload can include, for example, electronic circuitry (including, e.g., controls and processing), battery, sensors, etc. The payload also may include mechanism such as a parachute. The parachute may be in a portion of the housing that can open so that the parachute can deploy in certain situations. The parachute and/or corresponding portion of the housing 130 may couple with electronics that can provide the logic for deployment of the parachute.

The gimbal assembly 210 can include a gimbal coupled with a removable camera frame. The gimbal assembly 210 removably couples with the housing 130. Alternately, the gimbal assembly 210 can be integrated with the housing 130. The gimbal assembly 210 also can include a camera secured through the camera frame. The camera frame can be removed and fitted for the particular camera that couples with it. Alternately, the camera frame may be integrated with the gimbal.

Each arm 135 of the aerial vehicle 110 can removably couple with the housing 130. In addition, each arm 135 can mechanically, and removably, couple with a propeller 140 to create a rotary assembly. When the rotary assembly is operational, all the propellers 140 spin at appropriate direction and/or speeds to allow the aerial vehicle 110 to lift (take off), land, hover, and move (forward, backward) in flight.

The remote controller 120 in this example includes a first control panel 150 and a second control panel 155, an ignition button 160, a return button 165 and a display 170. It is noted that more or less control features and buttons may be included. In this example, the remote controller 120 can be used to control operation of the aerial vehicle 110. This operation can include pitch, roll and yaw control over the aerial vehicle 110 in addition to other functions.

Continuing with the example, the control panels 150, 155 can be used for control operations. The control panels can be mechanical (e.g., joystick, roller ball, etc.) or solid state (e.g., touch pad). For example, a first control panel 150 can be used to control "up-down" direction (e.g. lift and landing) of the aerial vehicle 110. A second control panel 155 can be used to control "forward-reverse" (e.g., thrust/drag) direction of the aerial vehicle 110. In addition, a combination of the panels 150, 155 with another controller mechanism, e.g., a wheel, can be used for "left-right" and/or hover movement. It is noted that these are just examples and that the controllers can be assigned other or different functions.

The ignition button 160 can be used to remotely turn on and/or start (as well as turn off or pause operation of) the aerial vehicle 110 rotary assembly (e.g., start the propellers 140). The return (or come home) button 165 can be used to override the controls of the remote controller 120 and transmit instructions to the aerial vehicle 110 to return to a predefined location as further described herein. The ignition button 160 and the return button 165 can be mechanical and/or solid state press sensitive buttons. In addition, each button 160, 165 may be illuminated with one or more light emitting diodes (LED) to provide additional details. For example, the LED can switch from one visual state to another to indicate with respect to the ignition button 160 whether the aerial vehicle 110 is ready to fly (e.g., lit green) or not (e.g., lit red) or whether the aerial vehicle 110 is now in an override mode on return path (e.g., lit yellow) or not (e.g., lit red). It also is noted that the remote controller 120 may include other dedicated hardware buttons and/or switches and those buttons and switches may be mechanical and/or solid state buttons and switches. For example, another button may be added to deploy the parachute.

The remote controller 120 also can include dedicated buttons corresponding to functions on the remote controlled aerial vehicle 110, for example, a camera shutter button for signaling (or triggering) taking still or video images, changing image capture resolution, changing frame rate, etc. Other buttons can be used for functions such as camera controls, including control settings, for example, tagging images, transmitting (or sharing) captured images, etc.

The remote controller 120 also may include a screen (or display) 170. The screen 170 provides for visual display. The screen 170 can be a touch sensitive screen. The screen 170 also can be, for example, a liquid crystal display (LCD), an LED display, an organic LED (OLED) display or a plasma screen. The screen 170 allows for display of information related to the remote controller, for example, menus for configuring the controller 120 and/or remotely configuring the aerial vehicle 110, and/or a camera coupled with the aerial vehicle 110. The screen 170 also can display images captured from a camera coupled with the aerial vehicle 110.

The remote controller 120 in this example includes a casing (or housing). The casing may be comprises of two or more parts. For example, a first casing may include the screen 170. Further by example, a second casing may include the control panels 150, 155, buttons 160, 165 and a speaker. The casing includes a cavity to house electronics for the components noted. Within either or both portions of the casing there may be an internal antenna. The antenna also may be configured external to the casing or a combination of internal and external.

Figure 2A:
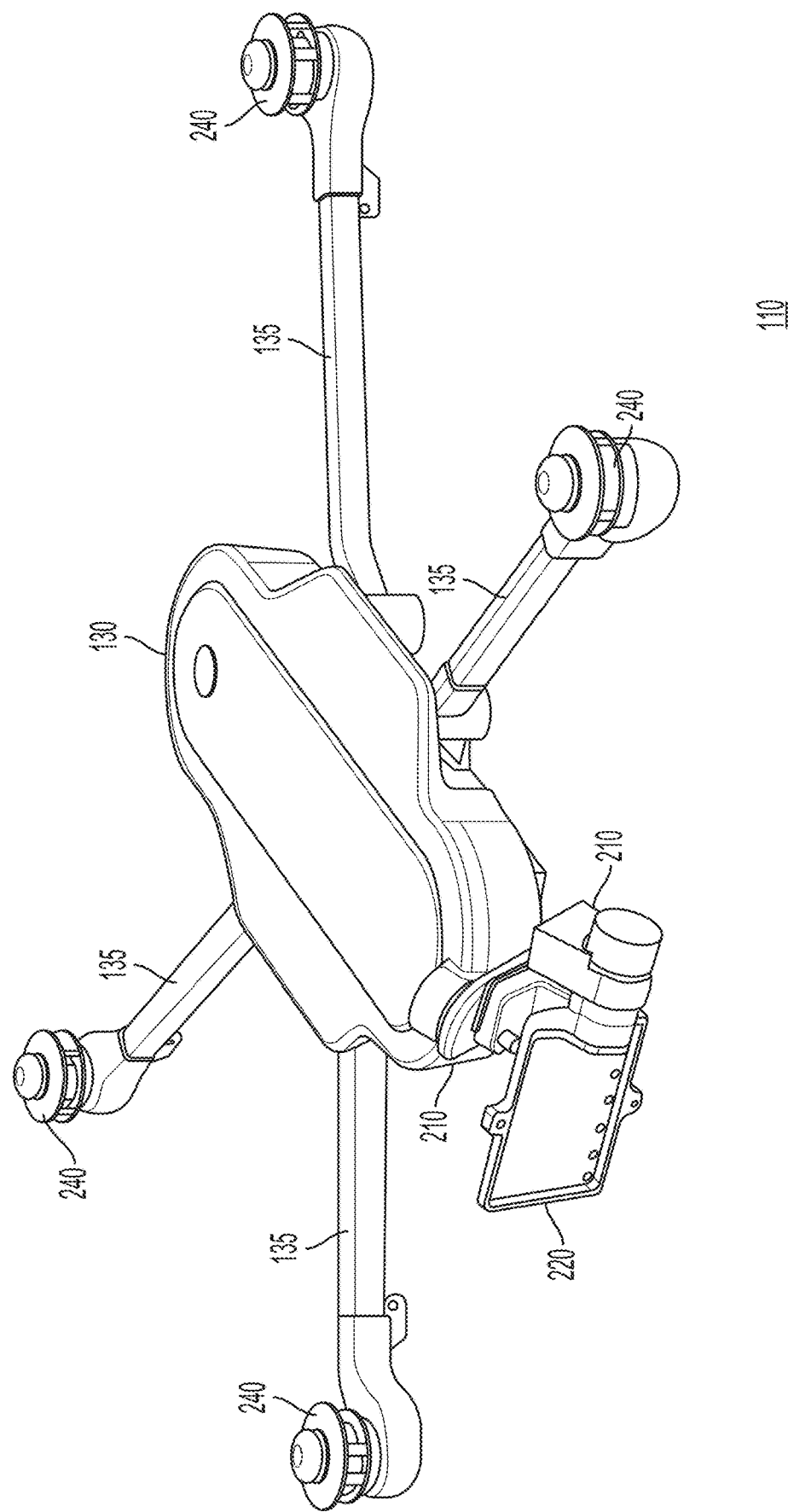
FIG. 2A illustrates a first embodiment of an aerial vehicle.

Briefly referring to FIGS. 2F and 2G, illustrated is an example remote controller 120 in an open position. This example remote controller 120 includes a power button 290, pivot points 291, wheel 292 and a speaker 293. Here, the casing is illustrated in two portions, one with the screen 170 and one with the other components. Each in this example is individually enclosed. The two parts of the casing are coupled through pivot points 291. The pivot points 291 are points or ends about which the screen 170 portion of the remote controller 120 rotates to "close" the remote controller 120, as shown in FIGS. 2H and 2I.

In these example illustrations of the remote controller 120, the shown power button 290 may powers the remote controller 120 in an ON, OFF, or STANDBY state. The wheel can be provide assigned functionality, for example, fine movements, "left or right" and/or hover movements. The speaker 293 may be used for audio playback through the remote controller 120. FIGS. 2H and 2I illustrate an example remote controller 120 in a closed position. FIG. 2I in particular also illustrates, by way of example, an additional switch 294, which can be assigned functionality, including, for example, power state or locking.

Remote Controlled Aerial Vehicle

FIGS. 2A-2E illustrate examples of the remote controlled aerial vehicle 110. By way of example, remote controlled aerial vehicle 110 can have the housing 130, arms 135, thrust motors 240, propellers 270 and landing gear 272.

In this example of the aerial vehicle 110, the arms 135 couple with the housing 130. A thrust motor 240 couples with each end of an arm 130, and this may form an arm assembly. Further, a propeller 270 may couple with each thrust motor 240. The thrust motor 240, when coupled with the propeller 140 (not shown here, but shown in FIG. 2B), spins the propeller when the motor is operational.

The arms 135 are configured so they can pivot about their connection point at the housing 130. For example, the arms 135 can be extended away from the housing for purposes of flight and can be folded back so the arms are close to the housing 130, for example, for storage or transport. In addition, each of the arms 135 is removably coupled with the housing 130 so that they can be removed and/or replaced, for example, in the event of wear, tear, or new designs. In addition, propellers that couple to each arm 135 are removable also, for example, for storage and/or replacement.

The housing 130 of the aerial vehicle 110 can be configured to be waterproof to reduce and/or eliminate water from entering the internal cavity of the housing 130 where electrical components are housed. Moreover, the aerial vehicle 110 is configured to allow incorporation of, or couple with, float structures made of, for example, removable foam, fiberglass or other material that is structured to allow the aerial vehicle 110 to float in the event of a water landing. The float structures, in addition to being removably coupled with the housing 130, also are configured to be aerodynamic to reduce wind drag during flight. Further, the arms 135 also may include optional removable floatation structures that assist with overall buoyancy of the aerial vehicle 110 in the event of a water landing or independently can float if they separate on from the housing 130 and land on water.

Figure 2B:
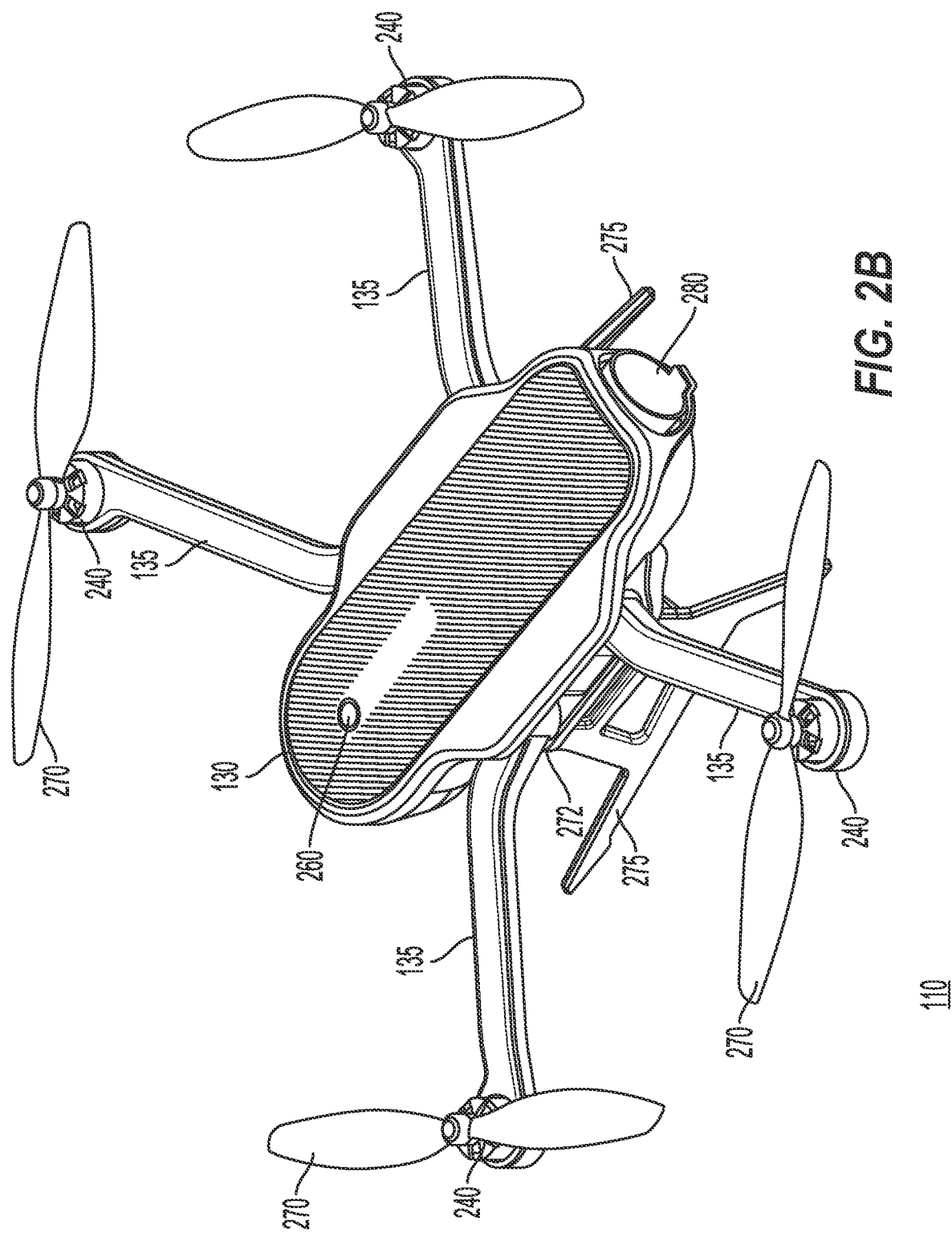
FIG. 2B illustrates an embodiment of an aerial vehicle with wings in an extended position.

Turning now to further description of the aerial vehicle configurations, FIG. 2B illustrates an example of the aerial vehicle 110 in an open position (or state). This example embodiment of the aerial vehicle 110 illustrates the housing 130, removably foldable arms 135, removable landing gear 272, and the rotors 240. Also shown is a start button 260 that can be used to place the aerial vehicle 110 in different operating states—e.g., ON, OFF, or STANDBY.

Figure 2C:
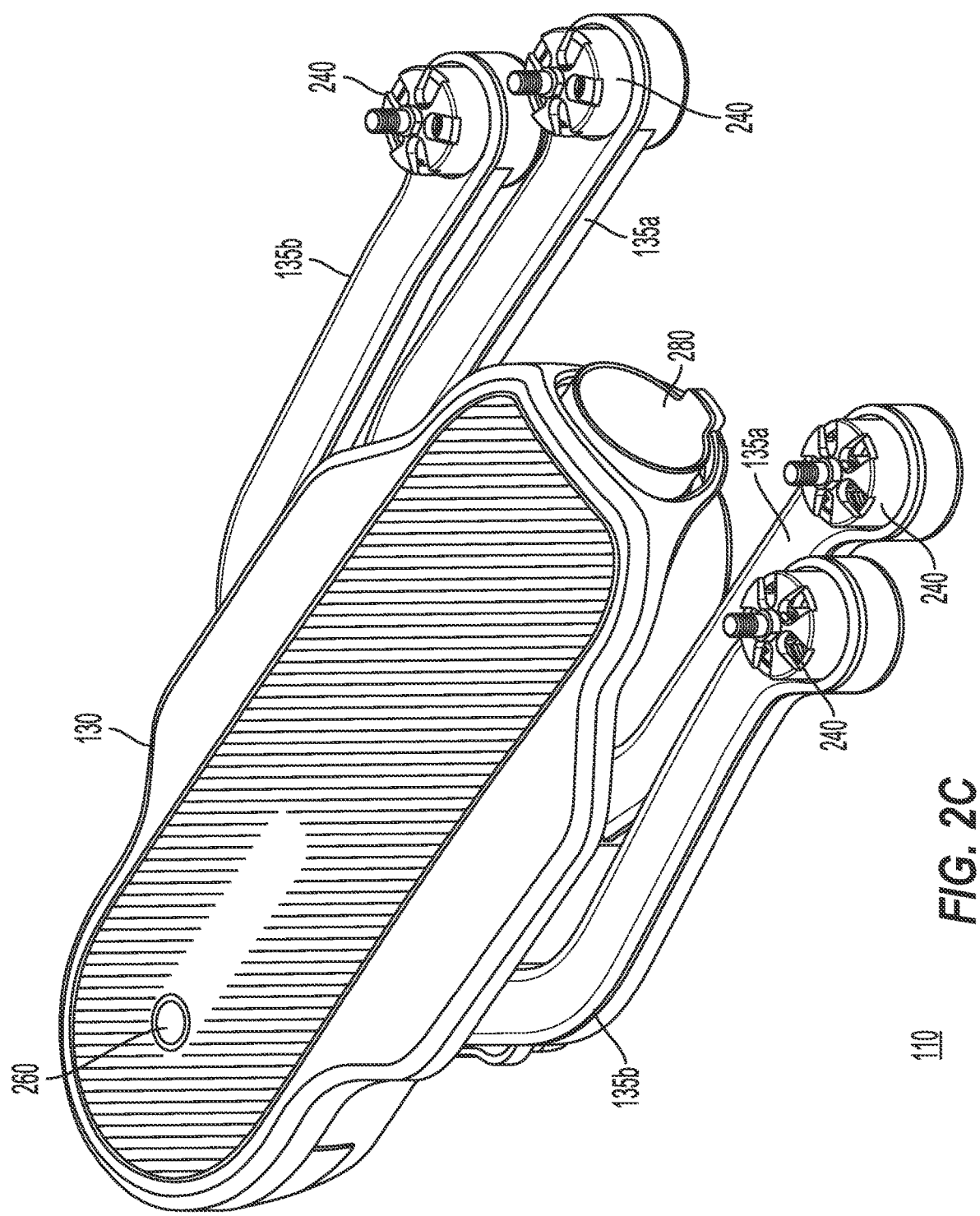
FIG. 2C illustrates an embodiment of an aerial vehicle with wings in an folded position.

FIG. 2C illustrates an example of the aerial vehicle 110 in a closed (folded) position (or state) and the propellers 270 removed. In the closed position illustrated, the landing gear 275 can be folded under the housing 130 or decoupled from the housing 130, e.g., for separate storage. Further, propellers 270 have been decoupled from the rotors 240, e.g., for separate storage. In addition, the arms 135 are shown folded against the housing 130 of the aerial vehicle. In this example, the structural elements of the arms 135 help enhance portability of the aerial vehicle 110 in a closed position by providing a compact footprint. For example, the arms on the same side couple with the housing 130 such that the when the arms are folded they are in a nested position relative to each other with rear arms substantially parallel with the front arms. Continuing with the example, a first set of arms (e.g., front arms) 135a have are in a lower elevational plane (e.g., "z-axis" plane) than a second set of arms (e.g., rear arms) 135b, as further illustrated with FIGS. 2D and 2E. This offset further helps create a compact footprint in the closed position as at least a portion of the second arm may overlap with a portion of the first arm in the nested position.

Figure 2D:
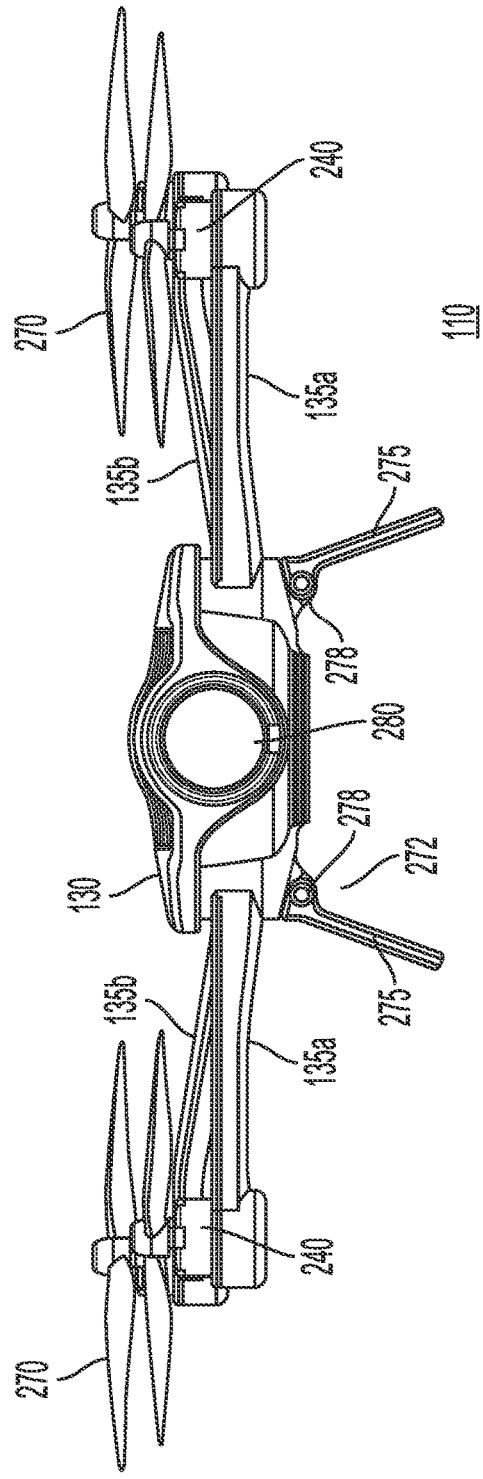
FIG. 2D illustrates a front view of the aerial vehicle.
Figure 2E:
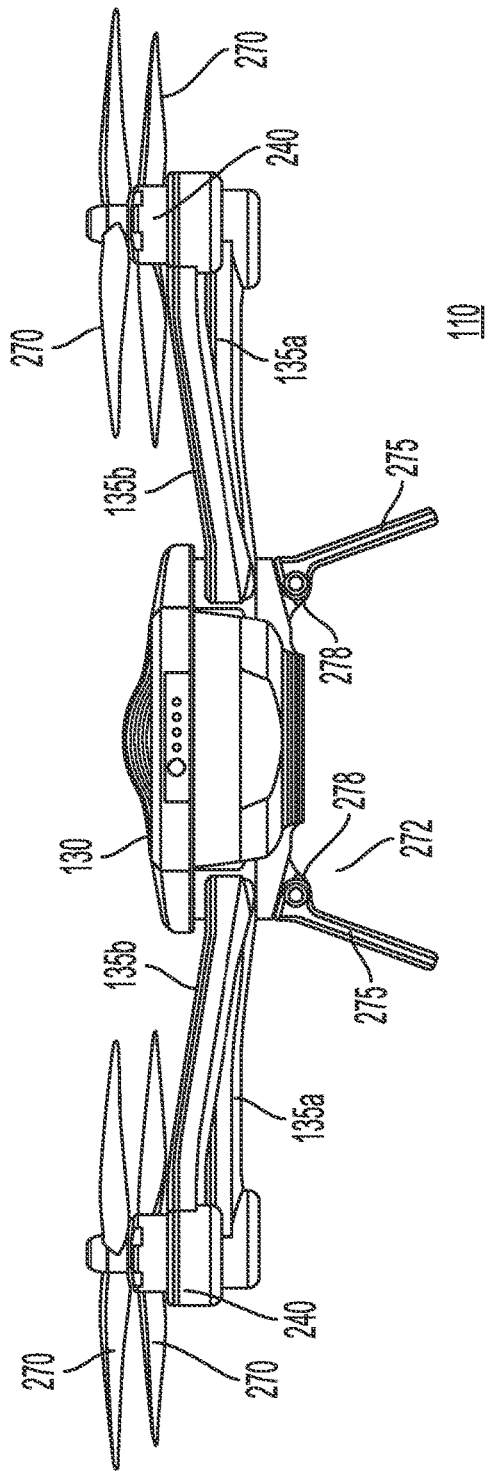
FIG. 2E illustrates a rear view of the aerial vehicle.
Figure 2I:
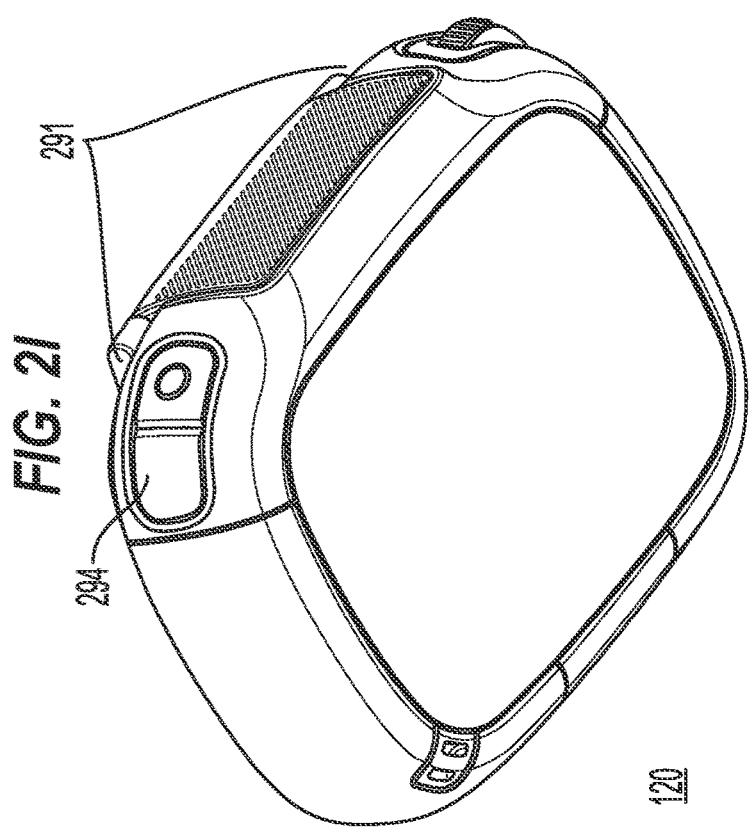
FIG. 2I illustrates a second perspective view of a controller for an aerial vehicle in an closed configuration.
Figure 2H:
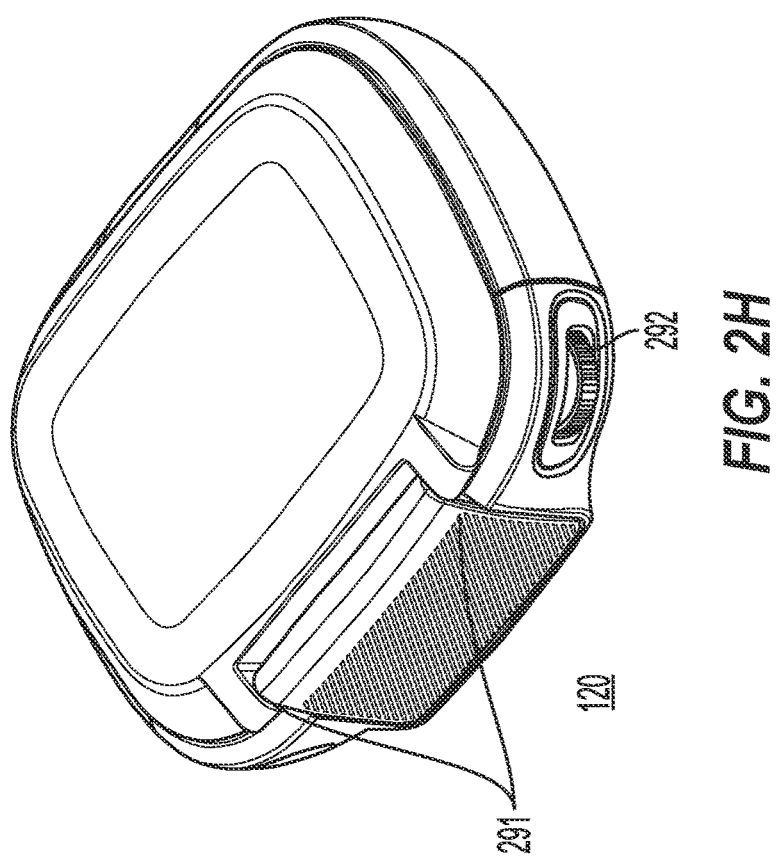
FIG. 2H illustrates a first perspective view of a controller for an aerial vehicle in an closed configuration.

FIG. 2D and FIG. 2E illustrate additional views of the aerial vehicle 110. FIG. 2D illustrates a first end view, e.g., where the gimbal opening 280 is located. FIG. 2E illustrates a second end view, e.g., opposite end of where the gimbal attachment mechanism 280 is located. In these views, the first set of arms 135a are shown to be in a lower elevational plane (e.g., "z-axis" plane) along a portion of the arm than the second set of arms 135b, which are in a higher elevational plane. This configuration allows the arms (generally 135) to be closer to the housing 130 when the arms are rotated into a folding position, as further shown in FIG. 2C. Moreover, as each arm 135 can be a unibody construction, structural rigidity is maintained while still providing a compact footprint.

The aerial vehicle 110 also includes removable landing gear 272. The landing gear 272 can have two or more legs 275 (or arms). The landing gear 272 may be removably coupled with the housing 130. The legs 275 are what the aerial vehicle 110 rests upon when on the ground, e.g., prior to flight and at landing. The legs 275 of the landing gear 272 can be folded against a bottom of the housing 130.

In addition, both FIGS. 2D and 2E illustrate the landing gear 272. The landing gear 272 includes two pivot points 278 about which the legs 275 rotate to fold inward toward the bottom of the housing 130. The landing gear 272 can be configured so that it fits within a recessed cavity of an underside, or bottom, of the housing 130. The recessed cavity can allow the legs 275 in the folded position to be substantially flush with the bottom of the housing 130 to further enhance portability by tucking the legs rather than having them remain apart from bottom of the housing 130 of the aerial vehicle 110. In addition, the legs 275 of the landing gear 272 may be removable from the housing 130. They may be removed, for example, for storage, and/or replaced as needed, e.g., due to wear and tear or updated structural configuration. The landing gear 272 and/or its legs 275 may include optional removable flotation structures that assist with overall buoyancy of the aerial vehicle 110 in the event of a water landing or independently can float if they separate from the housing 130 and land on water. The landing gear 272 also may incorporate electronics and/or mechanical structures to extend and retract the legs 275 of the landing gear automatically. For example, when the aerial vehicle 110 predetermined distance from the ground (e.g., as detected from a proximity sensor on the aerial vehicle), the legs may retract during ascent lift or extend during descent. Further, the remote controller 120 may be used to transmit signals to the aerial vehicle 110 to retract or extend the legs 275 of the landing gear 272.

The gimbal opening 280 can be configured to receive a gimbal 210. The gimbal opening 280 comprises a mechanical configuration that may include a releasable lock mechanism to receive an end of a gimbal and securely couple it relative to the aerial vehicle 110. The coupling is such that the gimbal 210 can remain coupled during flight. As the lock is releasable, the gimbal can be decoupled from the aerial vehicle 110 when desired. The gimbal 210, which may be coupled to the gimbal opening, is configured to allow for rotation of an object about an axis. Here, the object can be a camera mount 220 to which the gimbal 210 is mechanically coupled. The camera frame 220 may be configured to allow a camera (not shown) to couple (e.g., attach) to it and may include electrical connection points for the coupled camera. The gimbal 210 allows for the camera frame 220 to maintain a particular position so that the camera mounted to it can remain steady as the aerial vehicle 110 is in flight.

The gimbal 210 can, in some example embodiments, be an electronic three-axis gimbal which rotates a mounted object (e.g., a detachable camera frame connected to a camera) in space. In addition to providing part of an electronic connection between the camera and the aerial vehicle 110, the gimbal can include a sensor unit and a control logic unit, both of which are part of a gimbal control system. The gimbal control system detects the orientation of the gimbal 100 and camera, determines a preferred orientation of the camera, and controls the motors of the gimbal in order to re-orient the camera to the preferred position.

A sensor unit within the gimbal can include an inertial measurement unit (IMU) which measures rotation, orientation, and acceleration using sensors, such as accelerometers, gyroscopes, and magnetometers. The sensor unit can also contain rotary encoders, which detect the angular position of the motors of the gimbal 210, and a magnetometer to detect a magnetic field, such as the earth's magnetic field. In some embodiments, the sensors of the sensor unit are placed such as to provide location diversity. For example, a set of accelerometers and gyroscopes can be located near the camera (e.g., near the connection to the detachable camera frame) and a set of accelerometers and gyroscopes can be placed at the opposite end of the gimbal (e.g., near the connection to the aerial vehicle 110). The outputs of these two sets of sensors can be used by the IMU to calculate the orientation and rotational acceleration of the camera, which can then be output to the gimbal control logic. In some embodiments, the sensor unit is located on the aerial vehicle 110. In some embodiments, the gimbal control logic receives data from sensors (e.g., an IMU) on the aerial vehicle 110 and from the sensor unit of the gimbal 210.

In one embodiment, the gimbal 210 is removable from the camera frame 220 and structured for use with other devices, for example, a mount platform such as a tripod, a handheld grip, or an intelligent base. A mount platform can removably couple with the gimbal 210. By way of example, the mount platform (e.g., handheld grip) can include a plurality of buttons, which can be used by a user to control the camera and/or the gimbal 210. Note that some mount platforms, e.g., handheld grip, may contain a battery from which it can provide power to the gimbal 210 and may also be used to power and/or charge the camera in addition to operating any electronic functions on the handheld grip itself. It is noted that the mount platform can have controls and circuitry for wireless communication with other computing devices.

Example Aerial Vehicle Electronics/Control

Figure 3:
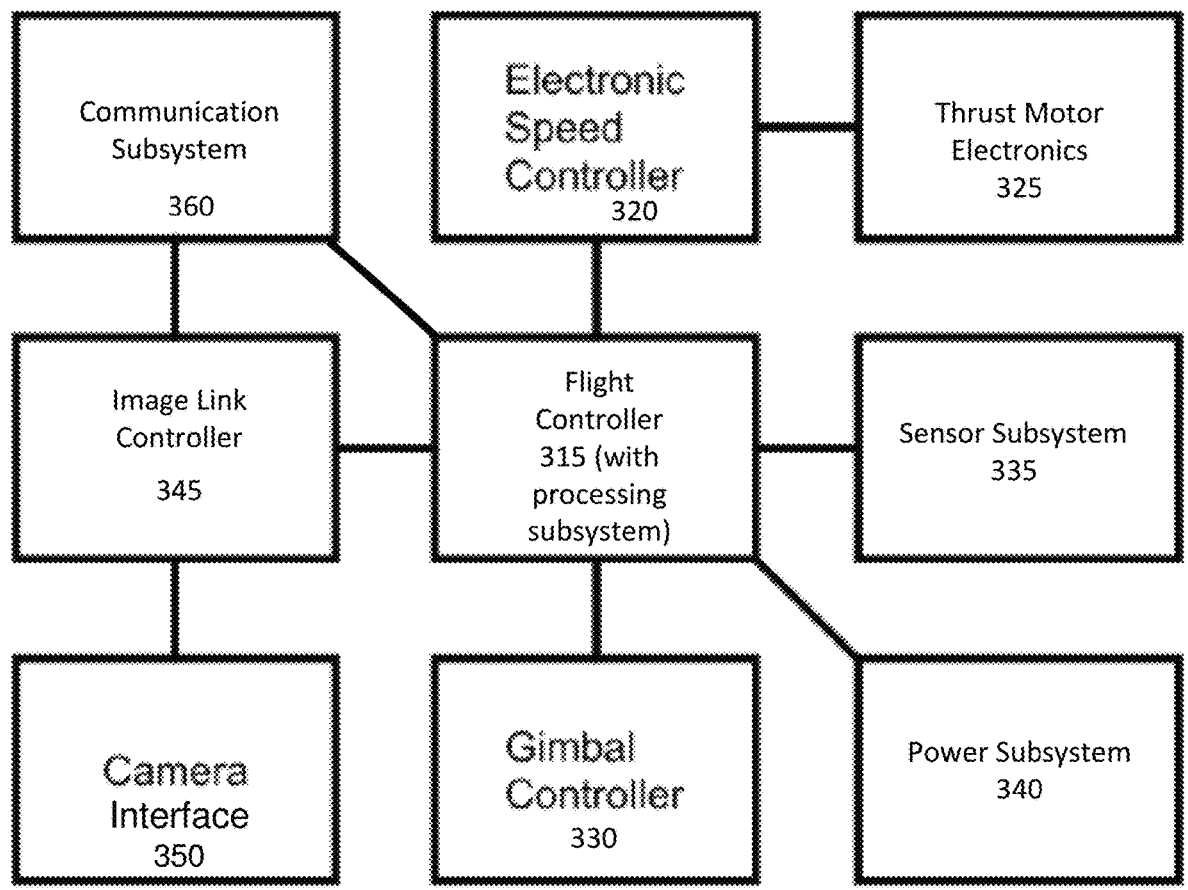
FIG. 3 illustrates a first block diagram of an example aerial vehicle system.

FIG. 3 illustrates an example embodiment of aerial vehicle electronics and control (EC) system 310 of the remote controlled aerial vehicle 110. The example EC system 310 may include a flight controller 315, an electronic speed controller (ESC) 320, one or more thrust motors electronics 325, a gimbal controller 330, a sensor subsystem (which can include telemetric subsystems) 335, a power subsystem 340, an image link controller 345, a camera interface 350, and a long range communication subsystem 360. The components communicate directly or indirectly with each other through a data bus on the aerial vehicle 110. The aerial vehicle 110 components can be embodied in hardware, software, or a combination thereof. The software, which can include firmware, may be referenced as program code, computer program product, or program instructions, and may be comprised of instructions. Software may be configured to operate with an operating system, which provides an interface to a processor. Software can be executed by one or more processors within the aerial vehicle 110. A processor also may include, for example, controllers, application specific integrated circuits (ASICS) and/or field programmable gate arrays (FPGAs). The processor can be configured to execute the software in a specific manner. FIG. 14 provides an additional example machine architecture with a processor that can be configured to execute software. It is noted that not all the components of FIG. 14 may be included in the aerial vehicle 110. FIG. 14 is intended to be illustrative in describing an architecture of which all or parts can operate within the aerial vehicle 110.

In this example, the aerial vehicle 110 may be configured to include an aerial vehicle operating system (AVOS). By way of example, the AVOS can be built on an operating system kernel, for example, LINUX, and/or be based on an operating system such as ANDROID OS. The software components of aerial vehicle operate with the AVOS. Examples of the software configurations are further described within this disclosure.

In one example embodiment, the communication subsystem 360 can include a long range WiFi system. It also can be and/or include another wireless communication system, for example, another WiFi system (e.g., one dedicated to direct control communications with the remote controller 120) and/or a communication system such as one based on long term evolution (LTE), 3G, 4G, or 5G mobile communication standards. The communication subsystem 360 also could be configured with a uni-directional remote control channel for communication of controls from the remote controller 120 to the aerial vehicle 110 and a separate unidirectional channel for an image downlink from the aerial vehicle 110 to the remote controller 120 (or to a video receiver where direct image connection may be desired). The communication subsystem 360 also can be used to allow for third-party services to provide over the air or hardwire link updates, such as firmware updates to the aerial vehicle 110.

In one example embodiment, the sensor subsystem 335 can include one or more sensors. Each set of sensors may be further grouped as modules to gather particular type of data. For example, the modules may be positional sensors and environmental sensors. Positional sensors can provide location and/or relative location in space and orientation information of the aerial vehicle 110. Positional sensors can assist with navigation and location related operations of the aerial vehicle 110. Positional sensors can include, for example, a gyroscope, accelerometer, a compass, a global positioning system (GPS) sensor, a motion sensor, and/or an altimeter. Environmental sensors can provide information of a particular environment. For example, environmental sensors can provide information on environmental conditions external to the housing 130 of the aerial vehicle 110. Further by example, environmental sensors can provide information on conditions within the housing 130 of the aerial vehicle 110. Environmental sensors can include, for example, a temperature sensor, a photodetector, a heat sensor, a moisture sensor, and/or a barometric sensor. It is noted that in some example instances a positional sensor can also operate as an environmental sensor for purposes of how the data may be used. For example, a photodetector may be used to determine time of day for a flight, but also can be used to detect shadows for avoidance detection. Note that other sensor configurations also may be included in addition to the examples given.

The sensor data from the sensor subsystem 335 may comprise sensor metadata and can be integrated with images from a camera. The video, which may also include additional metadata, e.g., from the camera, can be transmitted wirelessly to other devices and/or stored for late playback. When the images are displayed (e.g., played in real time or from storage), the sensor data can be extracted from it and provided for display on a screen, e.g., the screen 170 of the remote controller 120 or a screen of a computing device (e.g., laptop, smartphone, tablet, or desktop computer). The camera interface 350 can interface with a camera or may include an integrated camera. The integrated camera would be positioned similar to the camera mount 220 and the camera may incorporate a camera mount.

The power subsystem 340 may be configured to manage and supply power each of the components of the EC system 310. The power subsystem 340 can include a battery pack and a protection circuit module as well as a power control/battery management system. The battery can be replaceable and/or rechargeable. Due to its relatively large energy storage size, the battery of the power subsystem 340 can be configured to charge the camera in flight as needed or pre-flight. Other devices also may be charged using the large energy capacity of the battery of the power subsystem 340, for example, the remote controller 120, a powered handheld grip, or a mobile phone. The battery also can be used to charge the camera, or other devices, post-flight, depending on energy remaining in the battery. Further, the power subsystem 340 can be configured to include a dual power path. A first path allows for a first power level, e.g., low current, to be used to power up the aerial vehicle 110 and its onboard components. Once components are powered the aerial vehicle 110 can move to a second power level, e.g., high current, which is sufficient to consistently drive the rotors and onboard components during flight. In addition, a regenerative charging configuration can be integrated into the power subsystem 340. For example, the power subsystem 340 can include a recharge circuit electrically coupled with the drive motors so that when the motors are decelerating, current is pushed back through the recharge circuit to charge the battery of the power subsystem 340. The flight controller 315 of the EC system 310 communicates with the remote controller 120 through the communication subsystem 360. The flight controller 315 controls the flight related operations of the aerial vehicle 110 by control over the other components such as the electronic speed controller 320 and the sensor subsystem 335. The flight controller 315 interfaces with the gimbal control 330 to control the gimbal 210 and the image link 345 for camera operation control.

The electronic speed controller 320 is configured to interface with the thrust motors electronics 325. The electronic speed controller 320 may be configured to control the speed and thrust applied to the thrust motors 240, and accordingly the propellers 140, via the thrust motors electronics 325 of the aerial vehicle 110. The electronic speed controller 320 may control each motor 240 through the thrust motors electronics 325 individually or in groups or subgroups. It is noted that the thrust motors electronics 325 may be integrated with the thrust motors 240.

The image link controller 345 is configured to communicate with the camera interface to capture and transmit images from a camera to the remote controller 120 (and/or other device with screen such as a smart phone or tablet), e.g., via the communication subsystem 360. The video may be overlaid and/or augmented with other data from the aerial vehicle such as the sensor data from the sensor subsystem 335. When video is sent to both the remote controller 120 and another device, the overlaid information may be the same on each device or distinct on each device.

Example Aerial Vehicle Interconnect Architecture

Figure 4:
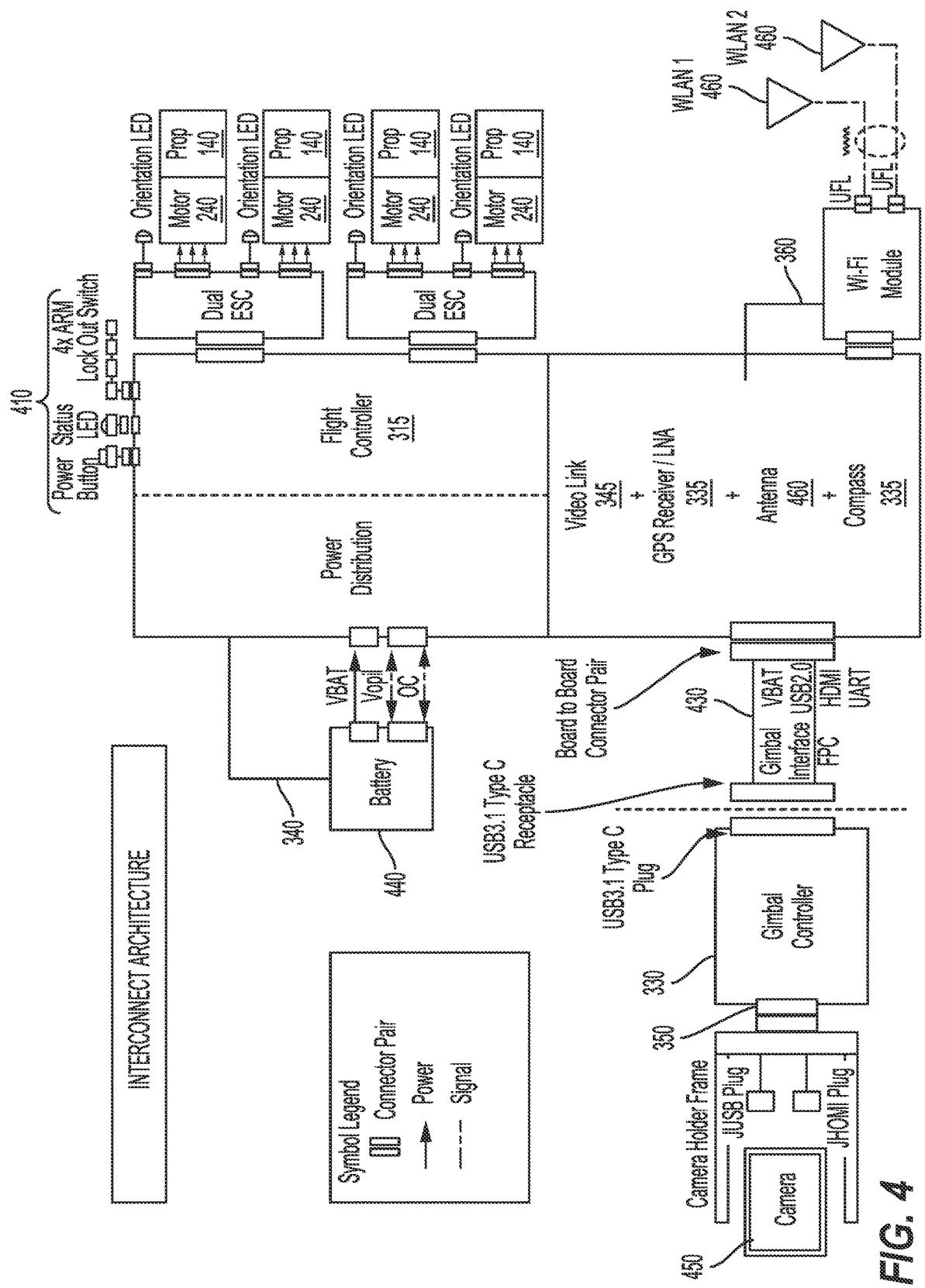
FIG. 4 illustrates a second block diagram of an example aerial vehicle system.

Turning to FIG. 4, it illustrates an example interconnect architecture of the remote controlled aerial vehicle 110 with the gimbal 220. This example embodiment includes the components illustrated and described in the prior figures, e.g., FIG. 3. In addition, there are shown additional components such as LEDs 410 on the aerial vehicle 110 that can be used to provide vehicle status related information. Also shown is a battery 440 as a part of the battery subsystem and an antenna 460 as a part of the communication subsystem 360.

In addition, the figure illustrates an example embodiment in which the flight controller 315 is coupled with two electronic speed controllers 320. Each electronic speed controller in this configuration drives two thrust motors 240, for example through the thrust motors electronics 325.

Also shown is a gimbal interface 430 that can couple the gimbal controller 330 with components of the EC system 310. In particular, the gimbal interface 430 is communicatively coupled with the video link 345, the sensor subsystem 335 (e.g., the GPS and the compass), and the antenna 460. The gimbal interface 430 is used to feed this data to the gimbal controller 330. The gimbal controller 330 uses this data to adjust the camera frame 220. It is noted that the camera frame 220 can secure a camera 450. The gimbal controller 330 is communicative coupled with the camera 450 through one or more camera interface connectors 430. The camera interface connectors 430 can include camera communication interfaces such as universal serial bus (USB) or HDMI. The media captured by the camera, e.g., still images, video, audio, can be communicated (transmitted) back to the aerial vehicle 110 through the camera interface connectors 430. The transmission of the media may be at high (or full) resolution (e.g., uncompressed) or at a lower (or partial) resolution (e.g., compressed). Data, e.g., sensor data from the sensor subsystem 335, also can be sent via the camera interface connectors 430 to the camera 450 to associate with video captured and stored on the camera 450.

Example Camera Architecture

Figure 5:
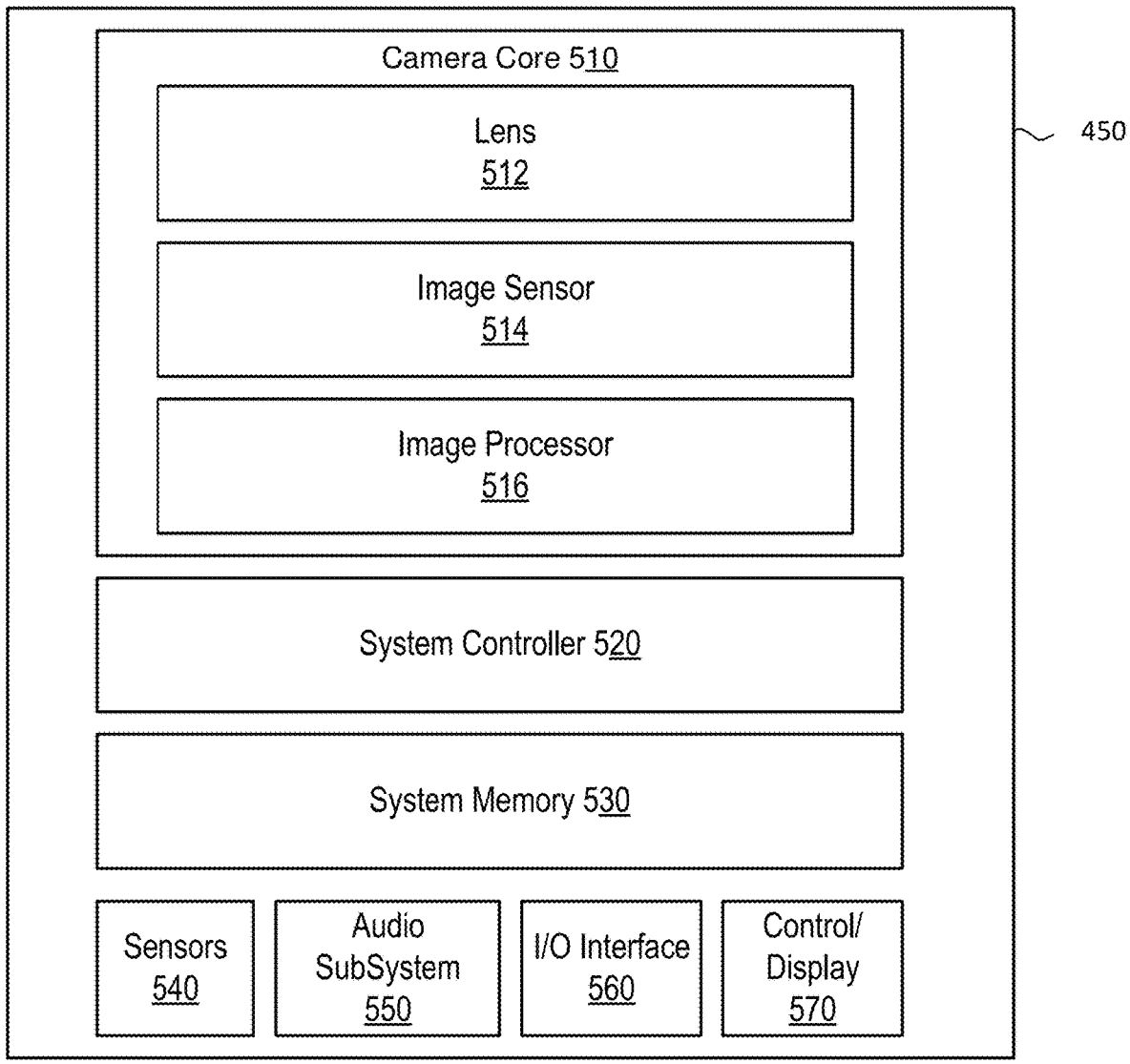
FIG. 5 illustrates a block diagram of an example camera system.

FIG. 5 illustrates a block diagram of an example camera architecture 505. The example camera architecture 505 corresponds to an architecture for the camera, e.g., 450. It is noted that the camera may be integrated with the aerial vehicle 110. When integrated with the aerial vehicle 110, the camera 450 may also be integrated with a gimbal, e.g., 210. Alternately, the camera 450 may be removably attached to the aerial vehicle 110. When removably attached, the camera 450 may be removably coupled to the gimbal 210 that couples the aerial vehicle 110. As previously noted, the gimbal 210 may be removably coupled with the aerial vehicle 110. Alternately, the gimbal 220 may be integrated with the aerial vehicle 110. For ease of discussion, the camera 450 is described in a configuration where it is removably coupled with the gimbal 220, which also is removably coupled with the aerial vehicle 110. However, the principles noted apply also in the instances in which the camera is integrated with the aerial vehicle 110.

Referring briefly to the camera 450, it can include a camera body, one or more a camera lenses, various indicators on the camera body (such as LEDs, displays, and the like), various input mechanisms (such as buttons, switches, and touch-screen mechanisms), and electronics (e.g., imaging electronics, power electronics, metadata sensors, etc.) internal to the camera body for capturing images via the one or more lenses and/or performing other functions. In one embodiment, the camera 450 is capable of capturing spherical or substantially spherical content. As used herein, spherical content may include still images or video having spherical or substantially spherical field of view. For example, in one embodiment, the camera 450 captures video having a 360 degree field of view in the horizontal plane and a 180 degree field of view in the vertical plane. Alternatively, the camera 450 may capture substantially spherical images or video having less than 360 degrees in the horizontal direction and less than 180 degrees in the vertical direction (e.g., within 10% of the field of view associated with fully spherical content). In other embodiments, the camera 450 may capture images or video having a non-spherical wide angle field of view.

As described in greater detail below, the camera 450 may include sensors to capture metadata associated with video data, such as timing data, motion data, speed data, acceleration data, altitude data, GPS data, and the like. In one example embodiment, location and/or time centric metadata (geographic location, time, speed, etc.) can be incorporated into an image (or media) file together with the captured content in order to track over time the location of the camera 450 or the subject being recorded by the camera 450. This metadata may be captured by the camera 450 itself or by another device (e.g., a mobile phone, a data tracker worn by a subject (e.g., a smart watch or fitness tracker equipped with tracking software or a dedicated radio frequency tracker), the aerial vehicle 110 via the camera interface 430, etc.)

proximate to the camera 450. In one embodiment, the metadata may be incorporated with the content stream by the camera 450 as the content is being captured. In another embodiment, a metadata file separate from the image file may be captured (by the same capture device or a different capture device) and the two separate files can be combined or otherwise processed together in post-processing. It is noted that these sensors can be in addition to the sensors of the sensor subsystem 335. In embodiments in which the camera 450 is integrated with the aerial vehicle 110, the camera need not have separate individual sensors, but rather could rely upon the sensors integrated with the aerial vehicle 110. The data captured by the sensors may be referenced as sensor metadata. The sensor metadata, as well as camera metadata from the camera 450, may be integrated with and/or used with aerial vehicle metadata captured from sensors on the aerial vehicle 110, for example, the environmental sensors, positional sensors, etc.

Referring now to the example camera architecture 505 of the camera 450, it may include a camera core 510 comprising a lens 512, an image sensor 514, and an image processor 516. The camera 450 also may include a system controller 520 (e.g., a microcontroller or microprocessor) that controls the operation and functionality of the camera 450 and system memory 530 configured to store executable computer instructions that, when executed by the system controller 520 and/or the image processors 516, perform the camera functionalities described herein. In some embodiments, a camera 450 may include multiple camera cores 510 to capture fields of view in different directions which may then be stitched together to form a cohesive image. For example, in an embodiment of a spherical camera system, the camera 450 may include two camera cores 510 each having a hemispherical or hyper hemispherical lens that each captures a hemispherical or hyper hemispherical field of view which is stitched together in post-processing to form a spherical image.

The lens 512 can be, for example, a wide angle lens, hemispherical, or hyper hemispherical lens that focuses light entering the lens to the image sensor 514 which captures video. The image sensor 514 may capture high-definition images having a resolution of, for example, 720p, 1080p, 4k, or higher. In one embodiment, spherical images may be captured as a 5760 pixels by 2880 pixels with a 360 degree horizontal field of view and a 180 degree vertical field of view. For images, the image sensor 514 may capture images at frame rates of, for example, 30 frames per second, 60 frames per second, or higher. The image processor 516 can perform one or more image processing functions of the captured images or video. For example, the image processor 516 may perform a Bayer transformation, demosaicing, noise reduction, image sharpening, image stabilization, rolling shutter artifact reduction, color space conversion, compression, or other in-camera processing functions. The image processor 516 also may be configured to perform real-time stitching of images, for example, when images are capture from two or more camera coupled with the aerial vehicle 110 and configured to capture images. Such example configurations may include, for example, an activity camera and a spherical camera capturing images, each with a substantially different field of view (FOV), but where there may be some overlap where the images can be stitched together. Processed images may be temporarily or persistently stored to system memory 530 and/or to a non-volatile storage, which may be in the form of internal storage or an external memory card, as shown and described in the example architecture of FIG. 4.

An input/output (I/O) interface 560 transmits and receives data from various external devices. For example, the I/O interface 560 may facilitate the receiving or transmitting image information through an I/O port. Examples of I/O ports or interfaces include USB ports, HDMI ports, Ethernet ports, audio ports, and the like. Furthermore, embodiments of the I/O interface 560 may include wireless ports that can accommodate wireless connections. Examples of wireless ports include Bluetooth, Wireless USB, Near Field Communication (NFC), and the like. The I/O interface 560 may also include an interface to synchronize the camera 450 with other cameras or with other external devices, such as a remote control, a second camera, a smartphone, a client device, or a video server. For example, a camera 450 mounted to an aerial vehicle 110 may be synchronized wirelessly (e.g., using time codes) with a camera on another aerial vehicle or on the ground so that video captured by the various cameras can be synchronized.

A control/display subsystem 570 includes various control components associated with operation of the camera 450 including, for example, LED lights, a display, buttons, microphones, speakers, and the like. The audio subsystem 550 includes, for example, one or more microphones and one or more audio processors to capture and process audio data correlated with video capture. In one embodiment, the audio subsystem 550 includes a microphone array having two or microphones arranged to obtain directional audio signals.

Sensors 540 capture various metadata concurrently with, or separately from, image capture. For example, the sensors 540 may capture time-stamped location information based on a global positioning system (GPS) sensor. Other sensors 540 may be used to detect and capture orientation of the camera 450 including, for example, an orientation sensor, an accelerometer, a gyroscope, an altimeter, or a magnetometer. Sensor data captured from the various sensors 340 may be processed to generate other types of metadata. For example, sensor data from the accelerometer may be used to generate motion metadata, comprising velocity and/or acceleration vectors representative of motion of the camera 450. Furthermore, sensor data from the aerial vehicle 110 and/or the gimbal 210/gimbal controller 330 may be used to generate orientation metadata describing the orientation of the camera 450. Sensor data from the GPS sensor provides GPS coordinates identifying the location of the camera 450, and the altimeter measures the altitude of the camera 450. In one embodiment, the sensors 540 are rigidly coupled to the camera 450 such that any motion, orientation or change in location experienced by the camera 450 is also experienced by the sensors 540. The sensors 540 furthermore may associates a time stamp representing when the data was captured by each sensor. In one embodiment, the sensors 540 automatically begin collecting sensor metadata when the camera 450 begins recording a video. As noted previously, the sensor data from the camera architecture may be integrated with and/or used with sensor data from the aerial vehicle 110.

As noted above, the camera 450 may also be controlled remotely, for example, through the remote controller 120, or through other devices in wireless communication with the camera, either directly or through the aerial vehicle 110. Accordingly, control functions of the camera 450 can be manipulated before, during or after flight (e.g., at landing). For example, during flight the camera 450 can be configured to switch from shooting images at 60 frames per second from 30 frames per second (fps). This example, an aerial vehicle 110 may follow a skier down a slope and start capturing images through the camera 450 at 30 fps. As the skier accelerates, e.g., for a jump, the camera 450 automatically switches to capturing images at 60 fps. Also by way of example, if the skier is in the distance, e.g., 20 meters, the camera 450 may being to capture images at 30 fps, but as the aerial vehicle draws closer, e.g., within 5 meters, the camera 450 can automatically switch to capturing images at 60 fps.

Moreover, an operator may seek to switch the camera 450 from taking images, in one mode, e.g., low resolution images, to taking images in another mode, e.g., high resolution images, while the aerial vehicle 110 is in flight and the camera 450 is operational. The positioning of the camera 450 can also be further controlled from an operator on the ground transmitting signals from the remote controller 120 or mobile device to move the camera angle through movement of appropriate gimbal 210 components. Further by example, at landing the camera 450 can be configured to take images, e.g., to assist with location analysis for locating the aerial vehicle 110.

Example Remote Control System

Figure 6:
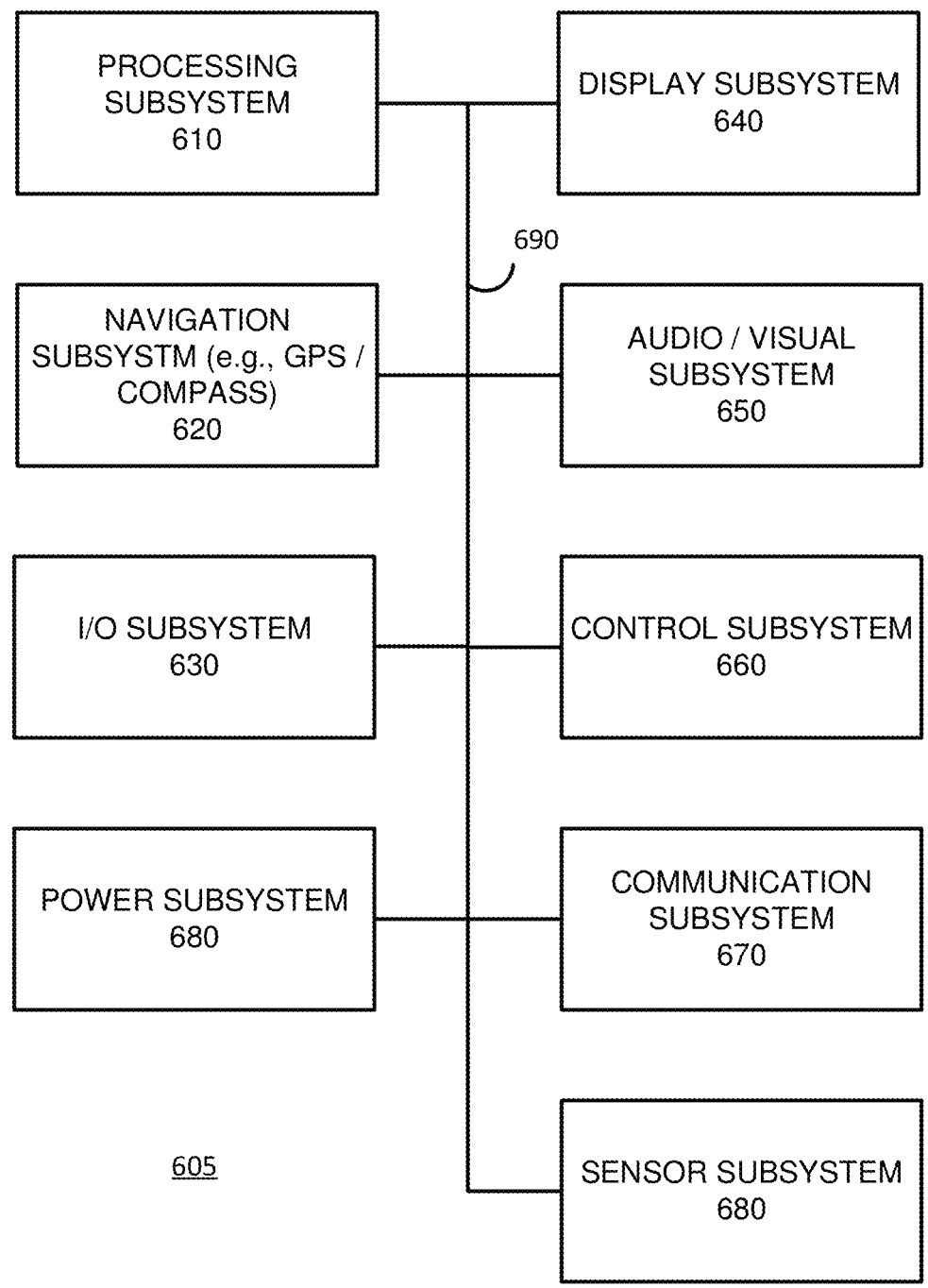
FIG. 6 illustrates a block diagram of an example remote controller.

FIG. 6 illustrates a block diagram of an example remote control system 605 of a remote controller, e.g., 120. The remote control system 605 includes a processing subsystem 610, a navigation subsystem 620, an input/output (I/O) subsystem 630, a display subsystem 640, an audio/visual (A/V) subsystem 650, a control subsystem 660, a communication subsystem 670, and a power subsystem 680. The subsystems are communicatively coupled through a data bus 690 and are powered, where necessary, through the power subsystem 680.

The processing subsystem 610 can be configured to provide the electronic processing infrastructure to execute firmware and/or software comprised of instructions. The software, which can include firmware, may be referenced as program code, computer program product, or program instructions, and comprises instructions. Software may be executed by one or more processors with the remote controller 120. A processor also may include, for example, controllers, application specific integrated circuits (ASICS) and/or field programmable gate arrays (FPGAs). The processor may be configured to execute the software in a specific manner. Software may be configured to operate with an operating system, which provides an interface to the processor.

The processing subsystem 610, which may include one or more processors, may be part of a machine and/or computer system. FIG. 14 provides an additional example machine with a processor that can be configured to execute software as part of the processing subsystem 610. It is noted that not all the components of FIG. 14 may be included in the remote controller 120, but rather illustrated and described in FIG. 14 as an architecture of which all or parts can operate as part of the processing subsystem 610 of the remote controller 120.

The processing subsystem 610 in this example also may be configured to include a remote controller operating system (RCOS). The RCOS may be built upon an operating system kernel, for example, an LINUX kernel, and/or an existing operating system, for example, an ANDROID operating system. In addition, the processing subsystem 610 can provide the execution framework for applications built to operate within the remote controller.

The navigation subsystem 620 includes, for example, electronics, controls and interfaces for navigation instrumentation for the remote controller 120. These may be embodied in hardware, software, or a combination thereof. For example, the navigation subsystem 620 uses a global position system (GPS) and a compass embodied in hardware (see sensor subsystem 685 below) and/or software for providing coordinates and headings information of the remote controller 120 relative to the aerial vehicle 110. In this example, the GPS and compass may be used to track location and heading of the remote controller 120, which can be helpful for the remote controller 120 and the aerial vehicle 110 to computationally understand location and positioning of each relative to the other.

The I/O subsystem 630 includes the input and output interfaces and electronic couplings to interface with devices that allow for transfer of information into or out of the remote controller 120. For example, the I/O subsystem 630 can a physical interface such as a universal serial bus (USB) or a media card (e.g., secure digital (SD)) slot. The I/O subsystem 630 also can be associated with the communication subsystems 670 to include a wireless interface such as Bluetooth. In addition, it is noted that in one example embodiment, the aerial vehicle 110 uses long range WiFi radio within the communication subsystem 670, but may also use a second WiFi radio or cellular data radio (as a part of the I/O subsystem 630) for connection other wireless data enabled devices, for example, smart phones, tablets, laptop or desktop computers, and wireless internet access points. Moreover, the I/O subsystem 630 may also include other wireless interfaces, e.g., Bluetooth, cellular (mobile) communication protocols, short range WiFi, etc., for communicatively coupling devices that are similarly wirelessly enabled for short range communications.

The display subsystem 640 is configured to provide an interface, electronics, and display drivers for the screen 170 of the remote controller 120. The display subsystem 640 can be configured to display information corresponding to the remote controller 120, for example, menus, settings, control information, etc. The display subsystem 640 also can be configured to display images captured from the camera 450 on the aerial vehicle 110. Moreover, the display subsystem can overlay images captured from camera on the aerial vehicle 110 with a display of gauges corresponding to metadata associated with captured video in a "dashboard" type visual display, for example, as illustrated in the example user interface in FIG. 13.

The A/V subsystem 650 includes the interfaces, electronics, and drivers for an audio output (e.g., headphone jack or speakers) as well as visual indicators (e.g., LED lighting associated with, for example, the buttons 160, 165). The A/V subsystem 650 can be configured to provide alarms, indicators, or other types of notifications audibly, visually, or a combination thereof. The notifications also can be in voice format. The A/V subsystem 650 can provide notifications corresponding to operation of the aerial vehicle 110 and/or the remote controller 120. For example, if battery power level drops below a threshold on the aerial vehicle 110, the aerial vehicle 110 can communicate this back to the remote controller 120. The A/V subsystem can provide a visual notification, e.g., flashing red LED, or an audible notification, e.g., beeping alarm and/or voice notice of the battery situation on the aerial vehicle 110. The A/V subsystem 650 also can provide notifications of other devices that may be communicatively coupled with the remote controller 120, e.g., a smartphone coupled with the remote controller 120 through a Bluetooth connection.

The control subsystem 660 includes electronic and control logic and firmware for operation with the control panels 150, 155. The control subsystem 660 translates movements on the control panels 150, 155 into appropriate movement commands corresponding to the aerial vehicle 110. The movement commands are transmitted through the communication subsystem 670 described below. The control subsystem 660 can be configured so that coarseness of movements through the control panels 150, 155 can be calibrated prior to transmission to the aerial vehicle 110. For example, users having a "light" touch (e.g., refined, smooth movement) can have touches through the control panels 150, 155 translated by the control subsystem 660 into a greater range of fine movements. Also by example, user with a "heavy" tough (e.g., more "jerky" control) can have touches through the control panels 150, 155 translated by the control subsystem 660 to have a lower range of fine movements to help ensure that such movements to not inadvertently jar the aerial vehicle 110 to an extreme that may cause it to stop flying.

The communication subsystem 670 includes electronics, firmware and interfaces for communications. The communications subsystem 670 can include one or more of wireless communication mechanisms, for example, WiFi (short and long range), cellular/mobile communication systems (e.g., long term evolution (LTE), 3G/4G/5G), BLUETOOTH, etc. The communication subsystem 670 also can include wired communication mechanisms such as Ethernet, USB, and HDMI. The communication subsystem 670 also can be used to allow for third-party services to provide over the air or hardwire link updates, such as firmware updates to the remote controller 120. It is noted that in some example embodiments, the communication subsystem 670 can include two (or more) different WiFi radios for communication. For example, one radio can be configured to be a dedicated connection between the remote controller 120 and the aerial vehicle 110. This communication coupling can help enhance communication between the devices as no other devices may compete for bandwidth and processing for communication between them. Continuing with the example, a second radio can be configured for other communications, for example, transmission of images and/or audio from the remote controller 120 to another device, e.g., a mobile hotspot, a laptop computer, a tablet, a smartphone, etc.

The power subsystem 680 can include electronics, firmware and interfaces for providing power to the system. The power subsystem 680 may include direct current (DC) power sources (e.g., batteries), but also can be configured for alternating current (AC) power sources. The power subsystem 680 also may include power management processes for extending DC power source lifespan. It is noted that in some embodiments, the power subsystem 680 may be comprised of power management integrated circuit and a low power microprocessor for power regulation. The microprocessor in such embodiments is configured to provide very low power states to preserve battery, and ability to wake from low power states from such events as a button press or an on-board sensor (like a hall sensor) trigger. It is noted that the power subsystem 680 may include a battery system that is replaceable and/or rechargeable. The battery can include a high energy storage capacity and can be configured to couple its power line with an interface, e.g., a universal serial bus interface, to which other devices, including the aerial vehicle 110 aerial vehicle 110 or a mobile computing device, can connect to have their batteries charge using this battery source.

In addition to GPS data, the remote controller 120 also may include sensors for other sensor data, e.g., temperature, altitude, precipitation. This sensor data from sensors can be integrated with images received from a camera. The sensor data can augment or supplement the sensor data captured and received from the aerial vehicle 110 and/or the camera 450. When the image is displayed (real time or from storage), the sensor data can be extracted from it can be provided for display on a screen, e.g., the screen 170 of the remote controller 120 or a screen of a computing device (e.g., laptop, smartphone, tablet, or desktop computer).

Registration System

In one embodiment, the system configuration 100 can be further configured to include a cloud based registration system. The cloud based registration system allows for uploading identification information corresponding to the aerial vehicle 110, remote controller 120, and/or the camera 450 coupled with the aerial vehicle 110. The registration information can include a serial number (or other identifier) associated with the specific component, i.e., aerial vehicle 110, remote controller, and/or camera, and also include additional identification information, for example, a name, address, telephone number, email, and/or messaging identifier associated with the registration, e.g., an owner and/or operator of the components. Once registered in the cloud the system can be further configured to include the registration information in a storage of the aerial vehicle 110, remote controller 120, and/or camera 450, e.g., in a flash memory and/or a removable storage medium such as removable flash card (e.g., an SD or microSD card).

Data Logging System

In an embodiment, the aerial vehicle system 100 may generate log data to track its operation. These logs may serve several purposes. First, the logs may be used analogously to a "black box" found in modern aircrafts to recover data about the system's operation. This may be useful, for example, in a situation where it is desirable for a customer service representative to understand the historic operation of the system in order to assist the user. For example, in the event of a crash, the log data may be valuable to assess why the crash occurred, whether the user was at fault, or a malfunction occurred. Second, the log data may be used by post-processing software to perform smart editing of video capture during flight. For example, knowledge of position and motion information of the aerial vehicle 110 may enable the editing tools to automatically identify video clips of interest within a long video file captured during flight. Third, the log data may be used to generate various analytical data that can be used to study operation of the various components of the system 100 and improve the system in future generations.

Figure 7:
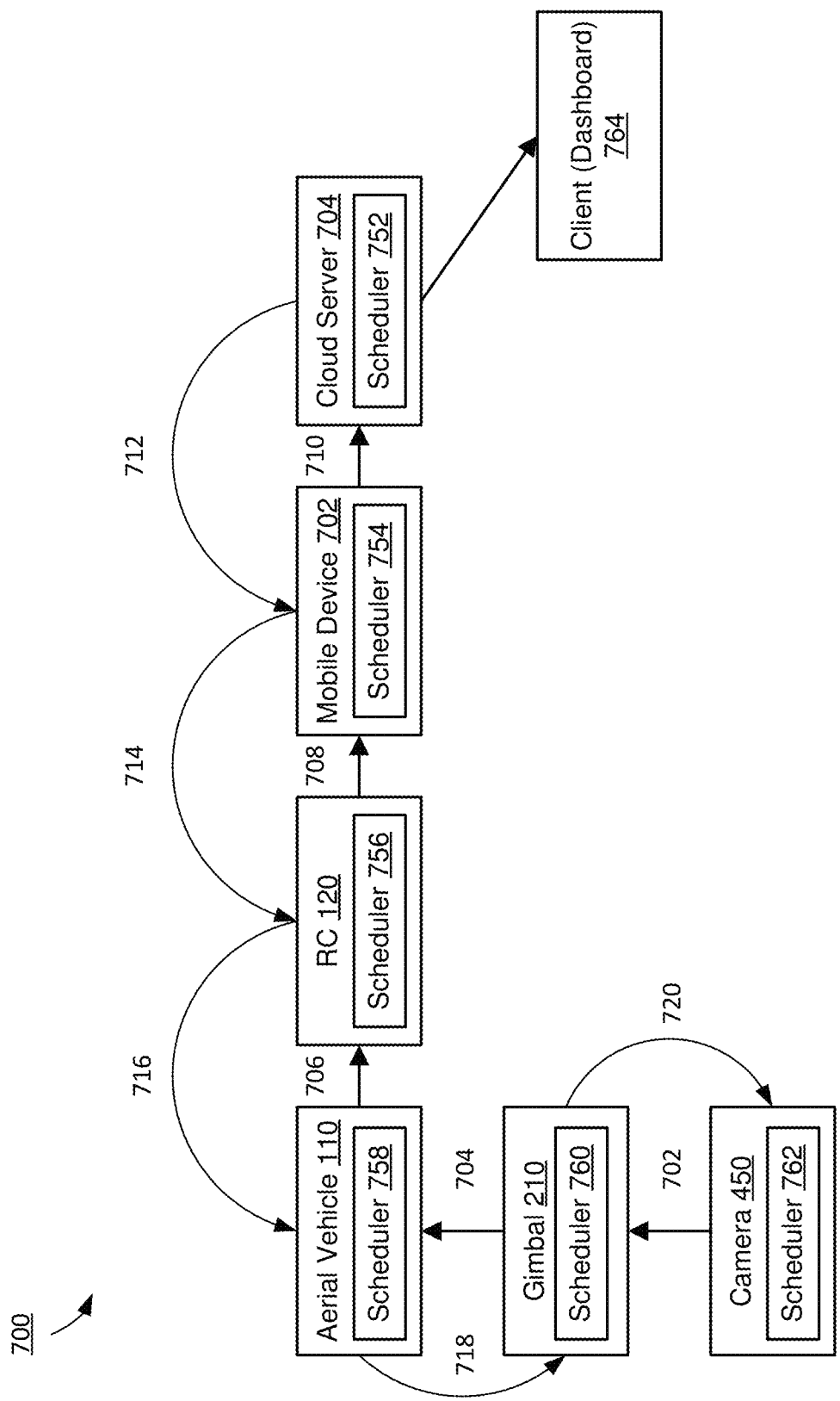
FIG. 7 illustrates a block diagram of a data logging system for an aerial vehicle.

FIG. 7 illustrates an example embodiment of a logging system 700. The system 700 may include a camera 450, a gimbal 210, an aerial vehicle 110, and a remote controller 120 as described above. Additionally, the remote controller 120 may be in communication with a mobile device 702 that operates to relay communications between the remote controller 120 and a cloud server 704, which in turn communicates with one or more clients 764 executing a dashboard application. The respective devices may be connected to one another via respective downlinks that stream data in a first direction and via respective uplinks that stream data in a second direction (e.g., opposite the first direction). For example, the downlinks may include a downlink 702 from the camera 450 to the gimbal 210, a downlink 704 from the gimbal 210 to the aerial vehicle 110, a downlink 706 from the aerial vehicle to the remote controller 120, a downlink 708 from the remote controller 120 to the mobile device 702, and a downlink 710 from the mobile device 702 to the cloud server 704. Furthermore, the uplinks may include an uplink 712 from the cloud server 704 to the mobile device 702, an uplink 714 from the mobile device 702 to the remote controller 120, an uplink 716 from the remote controller 120 to the aerial vehicle 110, an uplink 718 from the aerial vehicle 110 to the gimbal 210, and an uplink 720 from the gimbal 210 to the camera 450. In some embodiments, an uplink and downlink between a pair of devices may form parts of a same bidirectional connection between the devices.

In one embodiment, the system 700 generates and stores data logs associated with operation of each of the aerial vehicle 110, the gimbal 210, the camera 450, the remote controller 120, and the mobile device 702. For example, data logs associated with operation of the aerial vehicle 110 may include time-stamped telemetry metadata such as vehicle positioning information (e.g., GPS data), vehicle orientation, vehicle altitude, speed, acceleration, gyro data, raw compass data, battery voltage, throttle data, magnetometer data, IMU data, barometer data, temperature data, motor output rates, and other data associated with the aerial vehicle or collected during flight. Furthermore, data logs associated with operation of the aerial vehicle 110 may include control information that the aerial vehicle 110 receives (e.g., desired speed, orientation, flight path, or other control information), and error conditions, success conditions, or warning conditions, the aerial vehicle 110 generates. Furthermore, data logs associated with operation of the aerial vehicle 110 may include status information associated with the aerial vehicle 110 such as firmware version being operated, serial number, MAC address, and operational state.

Data logs associated with operation of the camera 450 may include, for example, control information that the camera 450 receives and outputs it generates, error conditions, information about file names and recording parameters used during flight, camera firmware version being operated, serial number, MAC address, or other information.

Data logs associated with operation of the gimbal 210 may include for example, gimbal orientation along each of its axes, state information for each axis (e.g., fixed or unfixed), speed, acceleration, motor output rates, error conditions, firmware version being operated, or other information relating to operation of the gimbal 210.

Data logs associated with operation of the remote controller 120 may include, for example, location information, speed, acceleration, orientation, control inputs the remote controller 120 receives from the user, error conditions generated, firmware version being operated, or other information relating to operation of the remote controller 120.

In one embodiment, each of the camera 450, the aerial vehicle 110, the remote controller 120, and the mobile device 702 store their respective log data to respective local storages. Alternatively, log data associated with one or more of the components may be stored to a local storage of a different device. For example, the camera 450 and the gimbal 210 may send data directly to the aerial vehicle 110 and the aerial vehicle stores log data in real-time for each of these devices.

In one embodiment, log data is stored to log files having a naming convention that reflects the date and time the log file was created and may also include a file index. The file index may be incremented after a power cycle. This ensures that log files are not overwritten in the case where the internal clock gets reset on power off. Additionally, the index may be used to indicate the sequence of the logs in cases when the system clock is not accurate. For example, a log file may be given a a file name including the characters i_dd-mm-yy_hh-mm-ss where i is the file index, dd is the day, mm is the month, yy is the year, hh is the hour, mm is the minute, and ss is the seconds corresponding to when the log file was created. In one embodiment, log files are limited to a maximum file size, after which the log file is closed and a new log file is created.

As illustrated in FIG. 7, the camera 450 sends log data (e.g., sensor metadata, status data, etc.) to the gimbal 210 via a link 702. If recording, the camera 450 may also send captured video data over this link 702. The captured video data may include a full resolution version and a reduced resolution version which may be used for image preview on the remote controller 120. In one embodiment, since the gimbal 210 and the camera 450 are typically physically connected, a wired link may be used as the link 702 between the camera and the gimbal 210. In other embodiments, the link 702 may be wireless.

The gimbal 210 combines the video and/or camera log data with gimbal metadata and transfers the combined data to the aerial vehicle 110 via a link 704. In one embodiment, since the gimbal 210 and the aerial vehicle 110 are typically physically connected, a wired link may be used as the link 704. In other embodiments, the link 704 may be wireless.

In another embodiment, the camera 450 may communicate directly with the aerial vehicle 110 (bypassing the gimbal 210) via a wired or wireless link.

The aerial vehicle 110 combines aerial vehicle metadata with the data received from the gimbal 210 and the camera 450 via the link 704, and transfers the combined data to the remote controller 120 via a link 706. The link 706 may be a wireless link.

The remote controller combines remote controller metadata with data received from the aerial vehicle 110, gimbal 210, and camera 450 via the link 706, and transfers the combined data to the mobile device 702 via the link 708. The link 708 may be a wireless link.

The mobile device 702 combines mobile device metadata with the data received for the remote controller 120, aerial vehicle 110, gimbal 210, and the camera 450 via the link 708, and transfers the combined data to the cloud server 704 via the link 710. The link 710 may be a wireless link such as a cellular or WiFi link.

In one embodiment, data logs stored by the aerial vehicle 110 (which may include data logs received from the camera 450 and the gimbal 210) are automatically transmitted from the aerial vehicle 110 to the remote controller 120 when a connection between the aerial vehicle 110 and the remote controller 120 is available. Similarly, the remote controller 120 in turn, may automatically transfer logs to the mobile device 702 (e.g., a mobile device) when connected. The mobile device 702 may similarly synchronize the log data to the cloud server 704 when connected.

If a connection from the aerial vehicle 110 to the remote controller 120 is lost during flight, a circular buffer may be used at the aerial vehicle 110 to buffer data until the connection is restored. Upon transferring the log data to the remote controller 120, the circular buffer may be flushed. In the case where there is a sufficient likelihood that the connection between the aerial vehicle 110 and the remote controller 120 will not be regained before a battery of the aerial vehicle dies (e.g., when the aerial vehicle is not connected to the remote controller 120 and the battery of the aerial vehicle 110 is below a threshold charge), the aerial vehicle 110 may transfer the contents of its buffer to a persistent storage (e.g., a non-volatile memory such as a FLASH drive) that is integrated with the aerial vehicle 110 or accessed via an external connection (e.g., a memory card slot). In another embodiment, the data is transferred only when an external memory card is available, and otherwise the data is lost on power off.

In one embodiment, link information is sent upstream via the upstream links 712, 714, 716, 718, and 720. The link information may include, for example, an indication of available bandwidth and/or delay associated with the corresponding downstream link. For example, the cloud server 704 sends link information via the upstream link 712 to the mobile device 702 indicating available bandwidth and/or delay associated with the link 710. The information can be used by the mobile device 702 to determine how much data it can send to the cloud server via the link 710 over a given time interval. The mobile device 702 similarly communicates link information to the remote controller 120 via the upstream link 714 indicating available bandwidth and/or delay associated with the link 708 and the link information associated with the link 710 received from the cloud server 704. The remote controller 120 similarly communicates link information to the aerial vehicle 110 via upstream link 716 indicating available bandwidth and/or delay associated with the link 706 and also includes the link information it received pertaining to the links 708, 710 downstream from it. The aerial vehicle 110 then relays the link information pertaining to the links 710, 708, 706 to the gimbal via upstream link 718, which in turn relays the information to the camera 450 via upstream link 720. Link information for links 704 and 702 may also be included although in instances where these links are wired, the link information may be substantially constant.

For each wireless link, a scheduler device 752, 754, 756, 758, 760, 762 prioritizes which data to send depending on the link information. Thus, in the case where more data is ready to be transmitted in a given time interval than can be sent over that link given the link parameters, the respective schedulers 752, 754, 756, 758, 760, 762 determine which data to send and which data to buffer for later transmission, or to discard. In some embodiments, the respective schedulers 752, 754, 756, 758, 760, 762 may also make this determination based on the processing capabilities and/or power availability of the associated device.

For example, in one embodiment, status information is generally given the highest priority, metadata is given medium priority, followed by first person video view data. Furthermore, in one embodiment, status and metadata relating to the aerial vehicle 110 is generally given highest priority, followed by the status and metadata relating to the gimbal 210, followed by status and metadata related to the remote controller 120, followed by status and metadata relating to the mobile device 702.

Following the general principles above, in one embodiment, the scheduler 758 for the aerial vehicle 110 prioritizes data it sends over the link 706 from the aerial vehicle 110 to the controller 120 as follows: (1) aerial vehicle status, (2) gimbal status, (3) aerial vehicle metadata, (4) gimbal metadata, (5) camera metadata, (6) low resolution video, (7) high resolution video. Furthermore, in one embodiment, the scheduler 754 for the mobile device 702 prioritizes data over the link 710 from the mobile device 702 to the cloud server 704 as follows: (1) aerial vehicle status, (2) gimbal status, (3) controller status, (4) aerial vehicle metadata, (5) gimbal metadata, (6) camera metadata, (7), remote controller metadata, (8) modem metadata, (9) low resolution video, (10) high resolution video.

In one embodiment, the scheduler 754 may furthermore prioritize uplink data sent via the link 714 and the scheduler 756 may furthermore prioritize uplink data sent via the link 716. For example, in one embodiment, the schedulers 754 prioritizes uplink data on link 714 as follows: (1) modem link budget, delay, and status; (2) flight enhancement data from the cloud server 752 (path tracking, camera modes, etc.), (3) information enhancement data from the cloud (other sites, other users, suggestions). The scheduler 756 may prioritize uplink data on link 716 from the remote controller 120 to the aerial vehicle 110 as follows, from highest priority to lowest priority: (1) aerial vehicle control signaling, (2) composite modem and remote controller budget and delays, (3) camera control, (4) gimbal control.

In one embodiment, to minimize the amount of data transmitted, data may be compressed using a binary key value assigned to an event followed by an event value. The event may be defined in a separate configuration file pre-shared between the controller 120, the aerial vehicle 110, and the server 704. The data definition may define all of the events with a binary event identifier, which may be a unique event descriptor. The data definition may define, for example, an event's data type (e.g., integer, float, long integer, signed, unsigned, string value, or other data type), data range, data units, data scale, data frequency, or other parameters. Various status events may be defined as integral codes with bitmasks to define the severity of the event.

Figure 8:
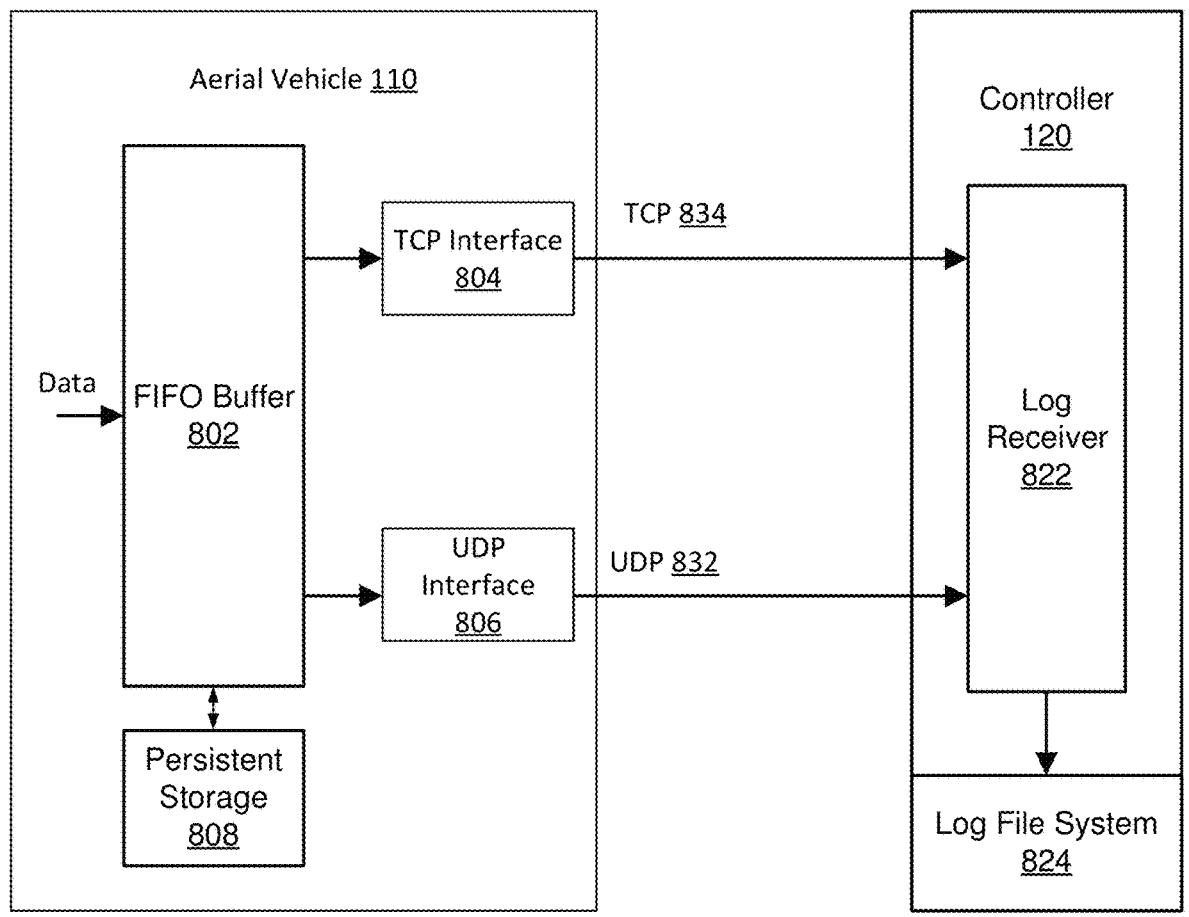
FIG. 8 is a block diagram of an example communication interface between an aerial vehicle and a remote controller.

FIG. 8 illustrates an embodiment of the components of the aerial vehicle 110 and the remote controller 120 that facilitate the downlink 706. The aerial vehicle 110 may include a first-in-first-out (FIFO) buffer 802, a persistent storage 808, a transmission control protocol (TCP) interface 804, and a user datagram protocol (UDP) interface 806. The controller 120 may include a log receiver 822 to receive log data and a log file system 824 that may write the log data to a file.

The FIFO buffer 802 stores sensor data from the aerial vehicle 110 or other downstream devices (e.g., the camera 140 and the gimbal 210) in the form of compressed log data. The FIFO buffer 802 may comprise volatile memory (e.g., random access memory (RAM)) that may be lost when power to the aerial vehicle 110 is lost. The persistent storage 808 may comprise non-volatile memory 808 that persists even without power to the aerial vehicle 110. The persistent storage 808 may serve as a backup to the data in the FIFO buffer 802 in the event that power to the aerial vehicle 110 is lost. For example, data in the FIFO buffer 802 that has not yet been transferred to the controller 120 may be periodically backed up to the persistent storage 808. Furthermore, data in the FIFO buffer 802 that has not yet been transferred to the controller 120 may be written to the persistent storage 808 when the battery in the aerial vehicle 110 is low and imminent loss of power is anticipated as will be described in further detail below.

The TCP interface 804 generates and transmits packets (which may include data from the FIFO buffer 802) over a TCP link 834 in the form of TCP packets to the log receiver 822 of the controller 120. The UDP interface 806 generates and transmits packets (which may include data from the FIFO buffer 802) over a UDP link 832 in the form of UDP packets to the log receiver 822 of the controller 120. Generally, transmitting log data via TCP protocol may have the advantage of guaranteeing delivery of packets because under TCP protocols, lost packets will be re-transmitted. However, if the link is lost, the data will be buffered at the aerial vehicle 110 until it can be transmitted. As a result, transmissions under TCP protocol may not all be real-time. In contrast, transmitting log data via UDP protocol may have the advantage of being near real-time. However, UDP protocol transmission may be subject to packet loss because data is not buffered when the link is lost. Sending data over TCP also may have significantly more overhead then sending the data over UDP. Thus, in poor network conditions the aerial vehicle 110 can determine not to send the data over TCP to avoid the overheads of retransmission of packets in TCP.

In an embodiment, when sufficient bandwidth is available (e.g., over a predefined threshold), the aerial vehicle 110 transfers the same data over both the TCP link 834 and the UDP link in parallel. By transmitting duplicate data in this manner, data that is time critical and that may not arrive in time to be useful over the TCP link 834 will be provided in near real-time via the UDP link 832. On the other hand, data that is not time critical and may be lost if transmitted only via the UDP link 832 can be provided (via re-transmissions if necessary) over the TCP link 834. Thus, providing duplicate data over the dual links takes advantage of the benefits of both types of links without the aerial vehicle 110 having to necessarily determine in advance which packets are better suited for the TCP link 834 and which are better suited for the UDP link 832.

In an embodiment, when sufficient bandwidth is not available (e.g., less than a predefined threshold) to transmit data over both the UDP link 832 and the TCP link 832, the aerial vehicle 110 gives preference to the UDP link 832. For example, in one embodiment, the aerial vehicle 110 uses all available bandwidth to transmit over the UDP link 832. If additional bandwidth is available, the aerial vehicle may transfer duplicate data over the TCP link 834.

When the link condition improves, TCP data may be sent over the TCP link 832 at a faster rate to catch up for the time it was not transmitted. The rate of transmission is determined in a way that does not impact transmission of control data or real-time video data provided to the remote controller.

In another embodiment, the aerial vehicle 110 may select between transmitting data via the TCP interface 804 and the UDP interface 806 depending on the type of data packet, the current link conditions, or other state conditions. For example, in one embodiment, video data received from the camera 140 is generally transmitted via the UDP interface 806 while sensor data is generally transmitted via the TCP interface 804.

After receiving the TCP or UDP data from the aerial vehicle 110, the log receiver 822 stores the data to the log file system 824. The log file system 824 may archive the log files. Furthermore, when a connection is available, log files may be transferred from the controller 120 to the mobile device 702.

In an embodiment, a logging format may incorporate events arising from the aerial vehicle platform 110, a gimbal, and a camera subsystem. The log format may be enable additional events and sensor data to be added at any sampling frequency and for additional parameters to be added with firmware updates. In one embodiment, the data generated by the aerial vehicle 110 may be signed and encrypted to avoid tampering of the logged events.

Figure 9:
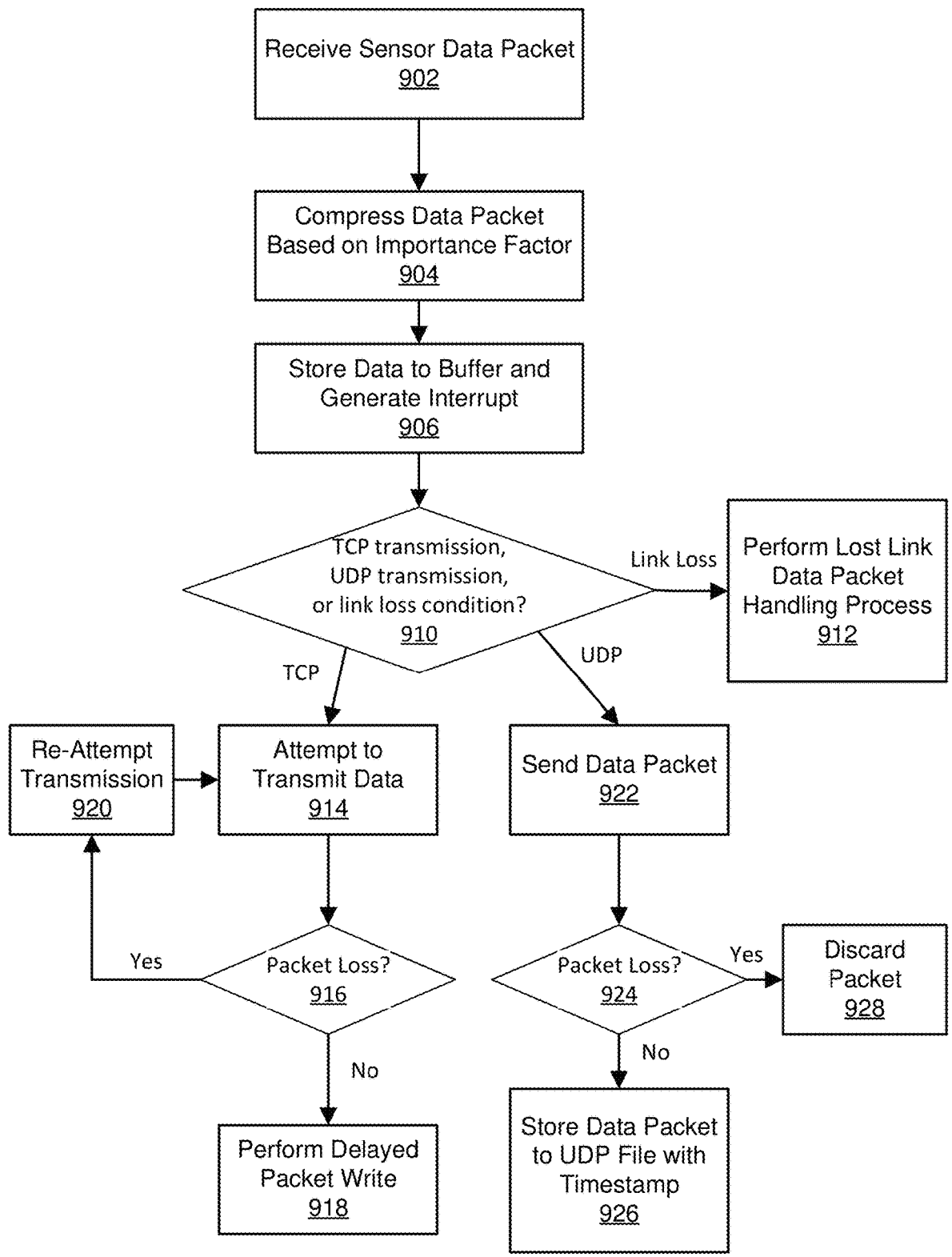
FIG. 9 is a flowchart illustrating an example of a process for controlling communications from an aerial vehicle to a remote controller.

FIG. 9 illustrates an embodiment of a process for transmitting data between devices (e.g., between the aerial vehicle 110 and the remote controller 120). The aerial vehicle 110 may receive 902 a data packet (e.g., sensor data and/or system state data). The data packet may be compressed 904 based on an importance factor. For example, different importance factors may be assigned to different categories of data, with different importance factors specifying a different level of compression (e.g., more important/ high importance factor data is less compressed than low importance/low importance factor data). The received data packet may be initially stored 906 to a buffer (e.g., buffer 802) and an interrupt is generated 906 to initiate a transmission. The aerial vehicle 110 may determine 910 whether, based on the current link conditions, the data packet will be transmitted via TCP protocol, via UDP protocol, both, or whether the data packet cannot be transmitted due to a lost or insufficient link. If a lost link condition is detected, the aerial vehicle 110 may perform 912 a lost link packet handling process, described in further detail below with respect to FIG. 10. If the aerial vehicle 110 determines to transmit the data packet via TCP protocol, the aerial vehicle may attempt 914 to transmit the data packet via TCP protocol and then may determine 916 whether the transmission was successful or whether a packet loss occurred. If a packet loss occurred, the aerial vehicle 110 may re-attempt 920 to transmission. If a packet loss did not occur, a packet write 918 may be performed.

If the aerial vehicle 110 determines to transmit the data packet via UDP protocol, the aerial vehicle may send 922 the data packet via UDP protocol and then determines if a packet loss occurred 924. If a packet loss occurred, the packet may be discarded 928. If a packet loss did not occur, the packet may be stored 926 to a UDP file with a timestamp.

In one embodiment, a frequency of data transmissions from the aerial vehicle 110 to the remote controller 120 may dynamically adjust based on various detected factors. For example, when a battery level of the aerial vehicle is detected to be low, the frequency of transmissions may be increased to reduce the possibility of data loss due to shutdown. Furthermore, in one embodiment, if conditions indicative of an imminent crash are detected, the frequency of sampling the sensors and transmitting the data to the remote controller 120 may be increased in order to collect additional data that may be useful in analyzing the crash.

Although the above process is described with respect to transmission from an aerial vehicle 110 to a remote controller 120, the process may similarly be applied to transmissions in the opposite direction or to transmissions between other devices.

Figure 10:
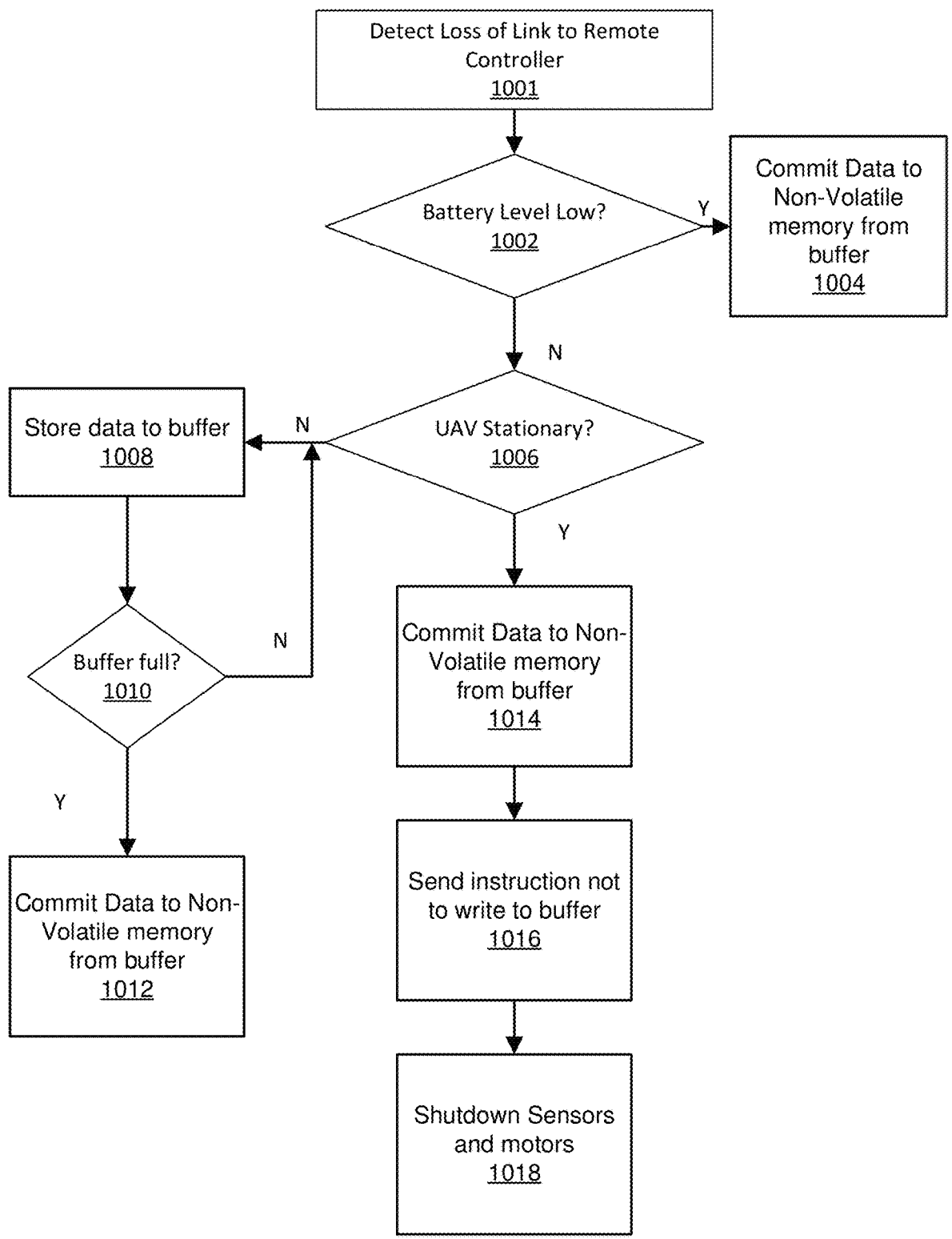
FIG. 10 is a flowchart illustrating an example of a process for handling a lost link between an aerial vehicle and a remote controller.

FIG. 10 illustrates an example embodiment of a process for handling a data packet when the wireless link (e.g., between the aerial vehicle 110 and the remote controller 120) is lost. The aerial vehicle detects 1001 the loss of the link to the remote controller 120. Responsive to this detection, the aerial vehicle 110 determines 1002 if its battery level is low. If the battery level is low, the aerial vehicle 110 may commit 1004 the data in the buffer 802 to persistent storage 808 so that it is not lost on power down. If the battery level is not low, the aerial vehicle 110 may determine 1006 whether the aerial vehicle 110 expected to shutdown 1006. For example, if the UAV loses its link to the remote controller and then becomes stationary, this may be indicative of a crash and a shutdown may be expected. If the aerial vehicle 110 is stationary, the aerial vehicle 110 may commit 1014 the data in the buffer 802 to the persistent storage 808. The aerial vehicle 110 then sends 1016 an instruction not to write further data to the buffer 802 and shuts down 1018 the sensors and motors so no further sensor data is generated and power consumption is reduced while the aerial vehicle 110 is stationary. If a shut down of the aerial vehicle 110 is not imminently expected (e.g., the aerial vehicle is in flight), it may store 1008 the data packets to the buffer 802 as they are generated by the various sensors or as the system state is updated. The aerial vehicle 110 may determine 1010 if the buffer 802 is full of data that has not yet been transferred to the remote controller 120, and if not full, may continue to store data to the buffer 802. If the buffer 802 is full of data that has not yet been transferred to the remote controller 120, the aerial vehicle 110 may commit 1012 the data in the buffer to the persistent storage 808 so that it is not overwritten.

In an embodiment, the data in the buffer 802 may be transferred to the remote controller 120 if the link is re-established. The previously stored data in the persistent storage 808 may also be transferred to the remote controller 120 upon re-establishing the link.

The process of FIG. 10 beneficially limits writes to the non-volatile memory only to situations when desirable to avoid data loss, e.g., when the data cannot be transmitted over the wireless link and the battery level is low, the buffer is full, or when the aerial vehicle is stationary and shutdown is imminent. By limiting the write cycles to the non-volatile memory, a relatively low cost non-volatile memory may be used that has a limited number of write cycles without impacting performance during the expected lifetime of the aerial vehicle.

Figure 11A:
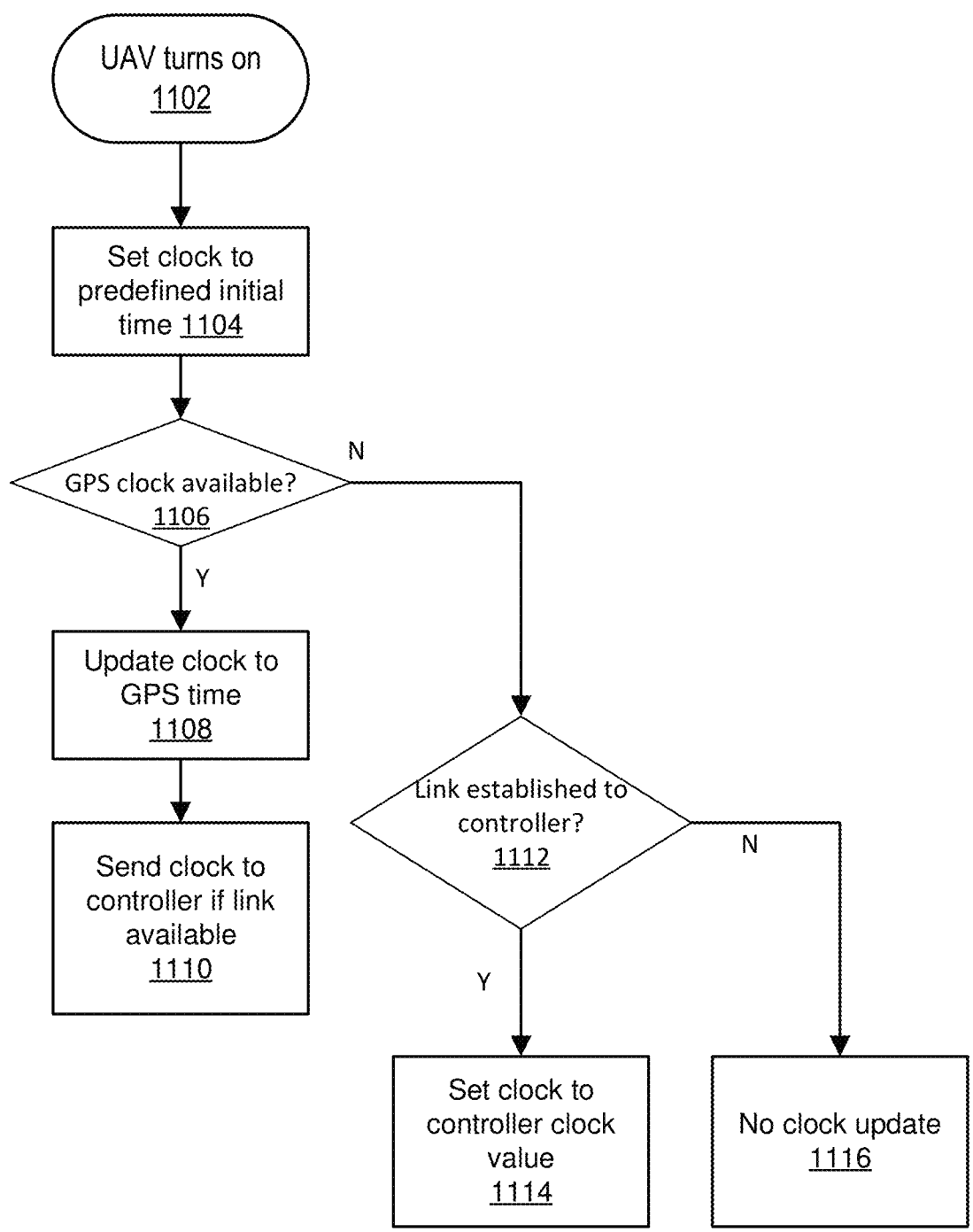
FIG. 11A is flowchart illustrating an embodiment of a process for configuring a clock on an aerial vehicle.
Figure 11B:
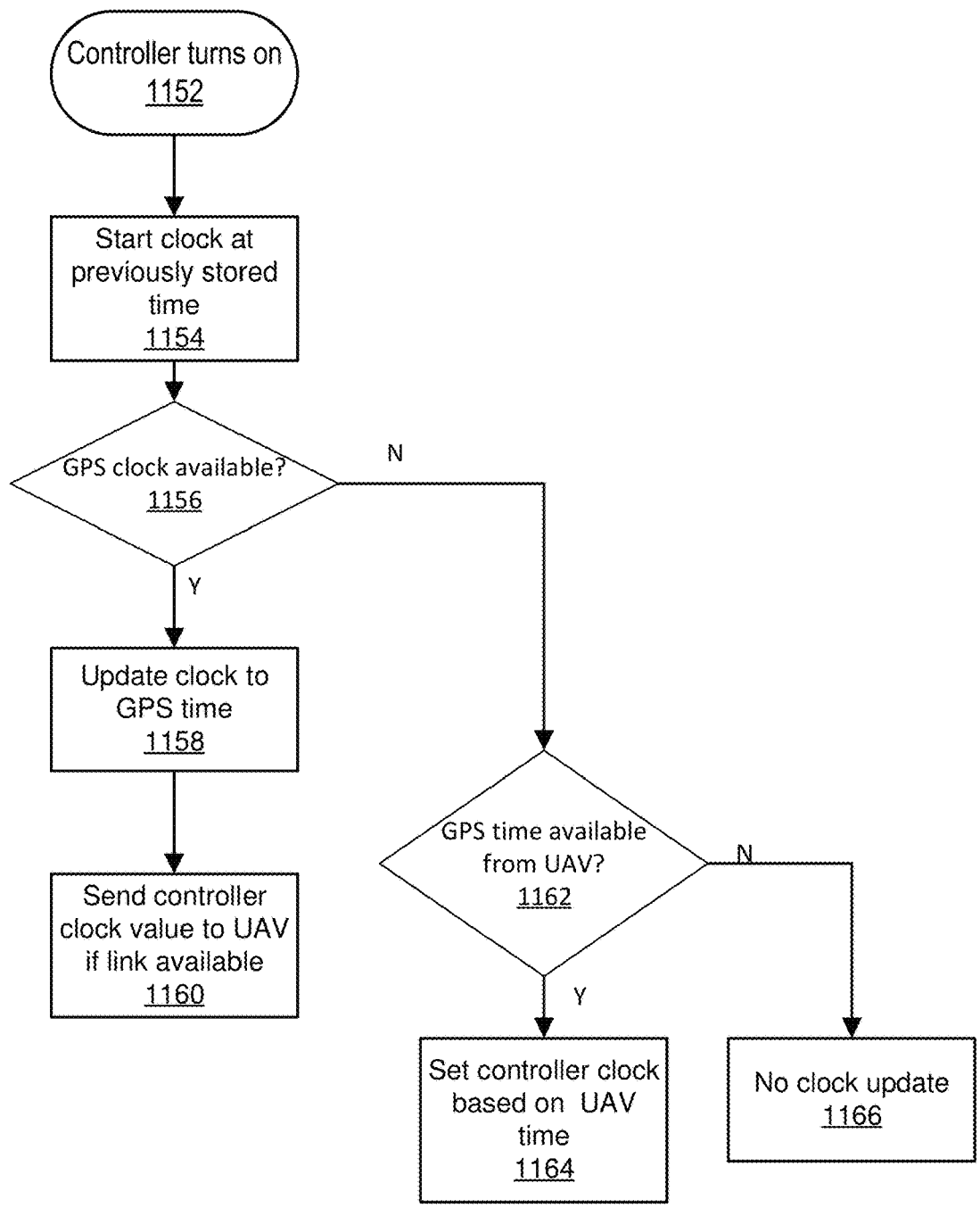
FIG. 11B is flowchart illustrating an embodiment of a process for configuring a clock on a remote controller.

FIGS. 11A and 11B illustrate processes performed by the aerial vehicle 110 and the remote controller 120 respectively to maintain clock synchronization between the aerial vehicle 110 and the remote controller 120. In FIG. 11A, the process may begin when the aerial vehicle 110 turns on 1102. The aerial vehicle 110 initially may set 1104 its clock to a predefined initial time. For example, the aerial vehicle 110 may initially set its clock to 1970 Unix time. The aerial vehicle 110 may then determine 1106 if GPS clock data is available. For example, the aerial vehicle 110 may check an integrated GPS device for GPS clock data if the GPS device has an active connection to the GPS. If the GPS clock data is available, the aerial vehicle 110 may update 1108 its clock using the available GPS time and may send 1110 the clock data to the remote controller 120 if the link is available. If the GPS clock data is not available, the aerial vehicle 110 may determine 1112 if a link is established with the remote controller 120. If the link is established, the aerial vehicle 110 may set 1114 its clock to a clock value received from the remote controller 120. If the link to the controller 120 is not established, then no clock update is performed 1116 and the clock may continue to run from the previously set time. The process beginning at step 1106 may re-execute periodically to re-synchronize the clocks.

In FIG. 11B, the process may begin when the remote controller 120 turns on 1152. The remote controller 120 may initially set 1154 its clock based on a previously stored clock time, which may be available due to the extended battery of the remote controller 120 relative to the aerial vehicle 110. The remote controller 120 then determines 1156 if GPS clock data is available. For example, the remote controller 120 may check an integrated GPS device for GPS clock data if the GPS device has an active connection. If the GPS clock data is available, the aerial vehicle may update 1158 its lock using the available GPS time and may send the clock data to the aerial vehicle 110 if the link is available. If the GPS clock data is not available, the remote controller 120 may determine 1162 if a GPS time is available from the aerial vehicle 110 via the wireless link. If the GPS time is available from the aerial vehicle 110, the remote controller 120 may set 1164 its clock based on the time received from the aerial vehicle 110. Otherwise, if the GPS time is not available from the aerial vehicle 110, no clock update may be performed 1168 at the remote controller 110 and the clock may continue to run from the previously set time. The process beginning at step 1156 may re-execute periodically to re-synchronize the clocks.

Example Machine Architecture

Figure 12:
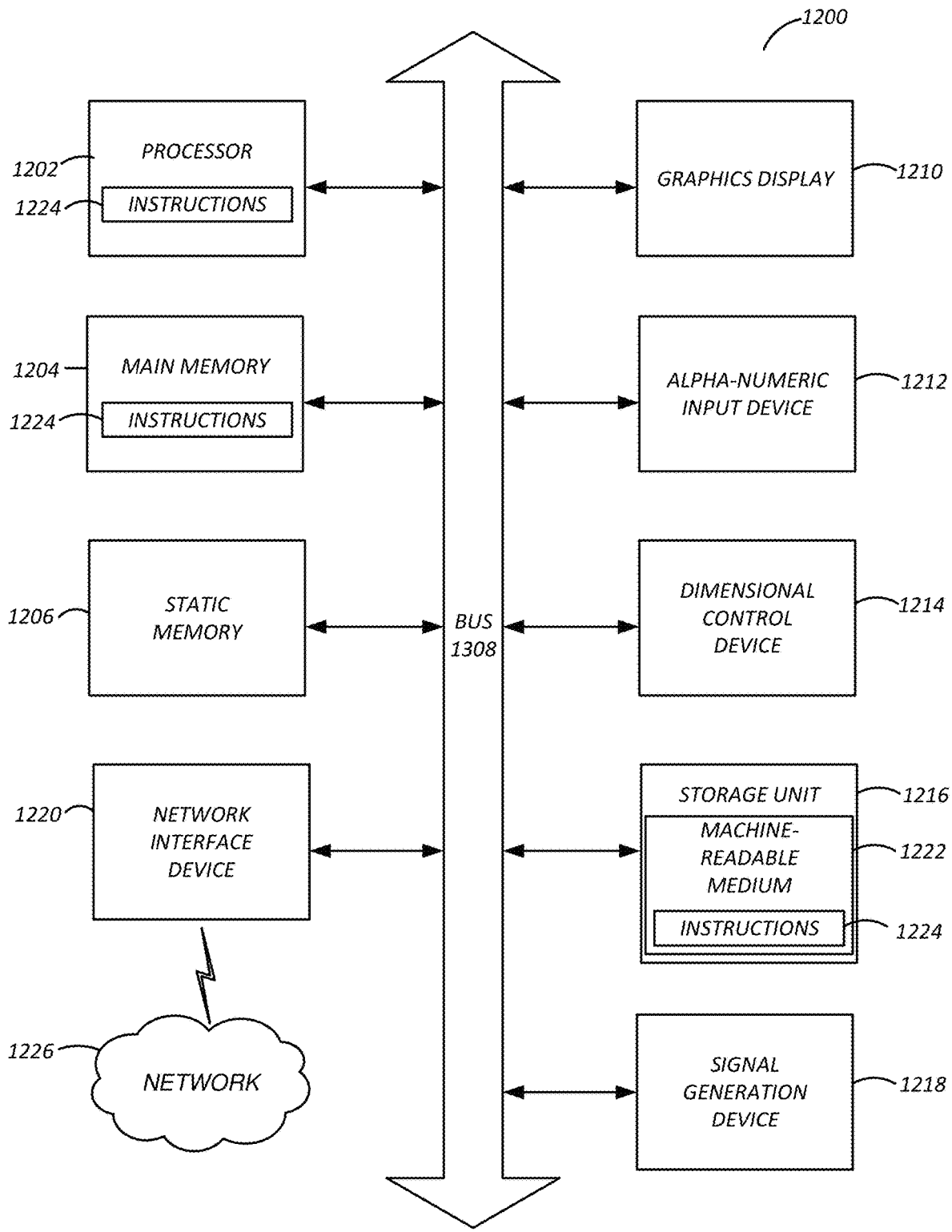
FIG. 12 is a block diagram illustrating example embodiment of a computing device.

As has been noted, the remote controlled aerial vehicle 110 can be remotely controlled from the remote controller 120. The aerial vehicle 110 and the remote controller 120 are machines that that be configured operated using software. FIG. 12 is a block diagram illustrating components of an example machine able to read instructions from a machine-readable medium and execute them in one or more processors (or controllers). All or portions of the example machine described in FIG. 12 can be used with the aerial vehicle 110 or the remote controller 120 and/or other parts of a system that interfaces with the aerial vehicle 110 and/or remote controller 120.

In FIG. 12 there is a diagrammatic representation of a machine in the example form of a computer system 1200. The computer system 1200 can be used to execute instructions 1224 (e.g., program code or software) for causing the machine to perform any one or more of the methodologies (or processes) described herein. In alternative embodiments, the machine operates as a standalone device or a connected (e.g., networked) device that connects to other machines. In a networked deployment, the machine may operate in the capacity of a server machine or a client machine in a server-client network environment, or as a peer machine in a peer-to-peer (or distributed) network environment.

The machine in this example is a handheld controller to control the remote controlled aerial vehicle. However, the architecture described may be applicable to other computer systems that operate in the system of the remote controlled aerial vehicle with camera and mounting configuration, e.g., in setting up a local positioning system. These other example computer systems include a server computer, a client computer, a personal computer (PC), a tablet PC, a smartphone, an internet of things (IoT) appliance, a network router, switch or bridge, or any machine capable of executing instructions 1224 (sequential or otherwise) that specify actions to be taken by that machine. Further, while only a single machine is illustrated, the term "machine" shall also be taken to include any collection of machines that individually or jointly execute instructions 1224 to perform any one or more of the methodologies discussed herein.

The example computer system 1200 includes one or more processing units (generally processor 1202). The processor 1202 is, for example, a central processing unit (CPU), a graphics processing unit (GPU), a digital signal processor (DSP), a controller, a state machine, one or more application specific integrated circuits (ASICs), one or more radio-frequency integrated circuits (RFICs), or any combination of these. The computer system 1200 also includes a main memory 1204. The computer system may include a storage unit 1216. The processor 102, memory 1204 and the storage unit 1216 communicate via a bus 1208.

In addition, the computer system 1206 can include a static memory 1206, a display driver 1210 (e.g., to drive a plasma display panel (PDP), a liquid crystal display (LCD), or a projector). The computer system 1200 may also include input/output devices, e.g., an alphanumeric input device 1212 (e.g., a keyboard), a dimensional (e.g., 2-D or 3-D) control device 1214 (e.g., a mouse, a trackball, a joystick, a motion sensor, or other pointing instrument), a signal generation device 1218 (e.g., a speaker), and a network interface device 1220, which also are configured to communicate via the bus 1208.

The storage unit 1216 includes a machine-readable medium 1222 on which is stored instructions 1224 (e.g., software) embodying any one or more of the methodologies or functions described herein. The instructions 1224 may also reside, completely or at least partially, within the main memory 1204 or within the processor 1202 (e.g., within a processor's cache memory) during execution thereof by the computer system 1200, the main memory 1204 and the processor 802 also constituting machine-readable media. The instructions 1224 may be transmitted or received over a network 1226 via the network interface device 1220.

While machine-readable medium 1222 is shown in an example embodiment to be a single medium, the term "machine-readable medium" should be taken to include a single medium or multiple media (e.g., a centralized or distributed database, or associated caches and servers) able to store the instructions 1224. The term "machine-readable medium" shall also be taken to include any medium that is capable of storing instructions 1224 for execution by the machine and that cause the machine to perform any one or more of the methodologies disclosed herein. The term "machine-readable medium" includes, but not be limited to, data repositories in the form of solid-state memories, optical media, and magnetic media.

Additional Considerations

The disclosed configurations beneficially provide an aerial capture platform to capture images, from a mounted camera 450, which may then be transmittable wirelessly to the remote controller 120 and/or other playback device, e.g., a mobile computing system. The images from the camera 450 may be overlaid, e.g., as metadata, with sensor data collected from the aerial vehicle 110 and/or the remote controller 120. The aerial vehicle 110 is configured for portability, e.g., folding arms 135 or landing gear 272, as well as modularity, e.g., arms 135, landing gear 272, and battery. The aerial vehicle 110, remote controller 120, and/or the camera 450 can be registered within a cloud system and the information registered in the cloud can be used to track each and/or communicate about each with the appropriate registrant.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Certain embodiments are described herein as including logic or a number of components, modules, or mechanisms, for example, as illustrated in the figures. Modules may constitute either software modules (e.g., code embodied on a machine-readable medium or in a transmission signal) or hardware modules. A hardware module is tangible unit capable of performing certain operations and may be configured or arranged in a certain manner. In example embodiments, one or more computer systems (e.g., a standalone, client or server computer system) or one or more hardware modules of a computer system (e.g., a processor or a group of processors) may be configured by software (e.g., an application or application portion) as a hardware module that operates to perform certain operations as described herein.

In various embodiments, a hardware module may be implemented mechanically or electronically. For example, a hardware module may comprise dedicated circuitry or logic that is permanently configured (e.g., as a special-purpose processor, such as a field programmable gate array (FPGA) or an application-specific integrated circuit (ASIC)) to perform certain operations. A hardware module may also comprise programmable logic or circuitry (e.g., as encompassed within a general-purpose processor or other programmable processor) that is temporarily configured by software to perform certain operations. It will be appreciated that the decision to implement a hardware module mechanically, in dedicated and permanently configured circuitry, or in temporarily configured circuitry (e.g., configured by software) may be driven by cost and time considerations.

The various operations of example methods described herein may be performed, at least partially, by one or more processors, e.g., processor 802, that are temporarily configured (e.g., by software) or permanently configured to perform the relevant operations. Whether temporarily or permanently configured, such processors may constitute processor-implemented modules that operate to perform one or more operations or functions. The modules referred to herein may, in some example embodiments, comprise processor-implemented modules.

The one or more processors may also operate to support performance of the relevant operations in a "cloud computing" environment or as a "software as a service" (SaaS). For example, at least some of the operations may be performed by a group of computers (as examples of machines including processors), these operations being accessible via a network (e.g., the Internet) and via one or more appropriate interfaces (e.g., application program interfaces (APIs).)

The performance of certain of the operations may be distributed among the one or more processors, not only residing within a single machine, but deployed across a number of machines. In some example embodiments, the one or more processors or processor-implemented modules may be located in a single geographic location (e.g., within a home environment, an office environment, or a server farm). In other example embodiments, the one or more processors or processor-implemented modules may be distributed across a number of geographic locations.

Some portions of this specification are presented in terms of algorithms or symbolic representations of operations on data stored as bits or binary digital signals within a machine memory (e.g., a computer memory). These algorithms or symbolic representations are examples of techniques used by those of ordinary skill in the data processing arts to convey the substance of their work to others skilled in the art. As used herein, an "algorithm" is a self-consistent sequence of operations or similar processing leading to a desired result. In this context, algorithms and operations involve physical manipulation of physical quantities. Typically, but not necessarily, such quantities may take the form of electrical, magnetic, or optical signals capable of being stored, accessed, transferred, combined, compared, or otherwise manipulated by a machine. It is convenient at times, principally for reasons of common usage, to refer to such signals using words such as "data," "content," "bits," "values," "elements," "symbols," "characters," "terms," "numbers," "numerals," or the like. These words, however, are merely convenient labels and are to be associated with appropriate physical quantities.

Unless specifically stated otherwise, discussions herein using words such as "processing," "computing," "calculating," "determining," "presenting," "displaying," or the like may refer to actions or processes of a machine (e.g., a computer) that manipulates or transforms data represented as physical (e.g., electronic, magnetic, or optical) quantities within one or more memories (e.g., volatile memory, non-volatile memory, or a combination thereof), registers, or other machine components that receive, store, transmit, or display information.

As used herein any reference to "one embodiment" or "an embodiment" means that a particular element, feature, structure, or characteristic described in connection with the embodiment is included in at least one embodiment. The appearances of the phrase "in one embodiment" in various places in the specification are not necessarily all referring to the same embodiment.

Some embodiments may be described using the expression "coupled" and "connected" along with their derivatives. For example, some embodiments may be described using the term "coupled" to indicate that two or more elements are in direct physical or electrical contact. The term "coupled," however, may also mean that two or more elements are not in direct contact with each other, but yet still co-operate or interact with each other. The embodiments are not limited in this context.

As used herein, the terms "comprises," "comprising," "includes," "including," "has," "having" or any other variation thereof, are intended to cover a non-exclusive inclusion. For example, a process, method, article, or apparatus that comprises a list of elements is not necessarily limited to only those elements but may include other elements not expressly listed or inherent to such process, method, article, or apparatus. Further, unless expressly stated to the contrary, "or" refers to an inclusive or and not to an exclusive or. For example, a condition A or B is satisfied by any one of the following: A is true (or present) and B is false (or not present), A is false (or not present) and B is true (or present), and both A and B are true (or present).

In addition, use of the "a" or "an" are employed to describe elements and components of the embodiments herein. This is done merely for convenience and to give a general sense of the invention. This description should be read to include one or at least one and the singular also includes the plural unless it is obvious that it is meant otherwise.

Upon reading this disclosure, those of skill in the art will appreciate still additional alternative structural and functional designs for an aerial capture platform through the disclosed principles herein. Thus, while particular embodiments and applications have been illustrated and described, it is to be understood that the disclosed embodiments are not limited to the precise construction and components disclosed herein. Various modifications, changes and variations, which will be apparent to those skilled in the art, may be made in the arrangement, operation and details of the method and apparatus disclosed herein without departing from the spirit and scope defined in the appended claims.

What is claimed is:

1. A method for managing data in an unmanned aerial vehicle, the method comprising:
    responsive to detecting a loss of a link to a remote controller, storing sensor data to a buffer and monitoring a flight status of the unmanned aerial vehicle, the flight status indicating whether the unmanned aerial vehicle is in motion; and
    responsive to detecting that the unmanned aerial vehicle is stationary following the loss of the link, transferring the sensor data from the buffer to a non-volatile storage.

2. The method of claim 1, further comprising:
    capturing the sensor data from sensors on the unmanned aerial vehicle; and
    transferring the sensor data from the unmanned aerial vehicle to the remote controller via a wireless interface.

3. The method of claim 2, wherein capturing the sensor data comprises:
    determining an importance factor for the sensor data; and
    selectively compressing the sensor data based on a compression level dependent on the importance factor.

4. The method of claim 1, further comprising:
    capturing system state information relating to a state of the unmanned aerial vehicle;
    transferring the system state information from the unmanned aerial vehicle to the remote controller via a wireless interface;
    responsive to detecting the loss of the link to the remote controller, storing the system state information to the buffer; and
    responsive to a battery level of the unmanned aerial vehicle dropping below a predefined threshold, transferring the system state information from the buffer to the non-volatile storage.

5. The method of claim 1, further comprising:
    responsive to detecting the loss of the link to the remote controller, storing the sensor data to the buffer and monitoring a battery level of the unmanned aerial vehicle; and
    responsive to the battery level dropping below a predefined threshold, transferring the sensor data from the buffer to the non-volatile storage.

6. The method of claim 1, further comprising:
    responsive to detecting that the unmanned aerial vehicle is in motion following the loss of the link, determining if the buffer is full of untransferred data; and
    responsive to the buffer being full, transferring the untransferred data to the non-volatile storage.

7. The method of claim 1, further comprising:
    determining an available bandwidth for transferring data between the unmanned aerial vehicle and the remote controller;
    selecting, based on the available bandwidth, a wireless interface for transferring a data packet to the remote controller, the wireless interface selected between a TCP interface and a UDP interface; and
    transferring the sensor data from the buffer to the remote controller via the wireless interface.

8. The method of claim 7, further comprising:
    responsive to detecting that the available bandwidth exceeds a first threshold, transferring the data packet in duplicate over both the TCP interface and the UDP interface.

9. The method of claim 7, further comprising:
    responsive to detecting that the available bandwidth does not exceed a first threshold, transferring the data packet over the UDP interface only.

10. The method of claim 1, further comprising:
    synchronizing a local clock of the unmanned aerial vehicle; and
    timestamping the sensor data using the local clock when storing the sensor data to the buffer.

11. The method of claim 10, wherein synchronizing the local clock comprises:
    synchronizing the local clock to a GPS clock from a GPS device integrated in the unmanned aerial vehicle when a GPS connection is available to the GPS device; and
    responsive to the GPS connection being unavailable, synchronizing the local clock to a controller clock on the remote controller.

12. A non-transitory computer readable storage medium storing instructions for managing data in an unmanned aerial vehicle, the instructions when executed by a processor causing the processor to perform steps including:
- capturing sensor data from sensors on the unmanned aerial vehicle;
- responsive to detecting a loss of a link to a remote controller, storing the sensor data to a buffer and monitoring a flight status of the unmanned aerial vehicle, the flight status indicating whether the unmanned aerial vehicle is in motion; and
- responsive to detecting that the unmanned aerial vehicle is stationary following the loss of the link, transferring the sensor data from the buffer to a non-volatile storage.

13. The non-transitory computer readable storage medium of claim 12, wherein the instructions when executed further cause the processor to perform steps including:
- capturing system state information relating to a state of the unmanned aerial vehicle;
- transferring the system state information from the unmanned aerial vehicle to the remote controller via a wireless interface;
- responsive to detecting the loss of the link to the remote controller, storing the system state information to the buffer; and
- responsive to a battery level of the unmanned aerial vehicle dropping below a predefined threshold, transferring the system state information from the buffer to the non-volatile storage.

14. The non-transitory computer readable storage medium of claim 12, wherein the instructions when executed further cause the processor to perform steps including:
- responsive to detecting the loss of the link to the remote controller, storing the sensor data to the buffer and monitoring a battery level of the unmanned aerial vehicle; and
- responsive to the battery level dropping below a predefined threshold, transferring the sensor data from the buffer to the non-volatile storage.

15. The non-transitory computer readable storage medium of claim 12, wherein the instructions when executed further cause the processor to perform steps including:
- responsive to detecting that the unmanned aerial vehicle is in motion following the loss of the link, determining if the buffer is full of untransferred data; and
- responsive to the buffer being full of the untransferred data, transferring the untransferred data to the non-volatile storage.

16. The non-transitory computer readable storage medium of claim 12, wherein the instructions when executed further cause the processor to perform steps including:
- determining an available bandwidth for transferring data between the unmanned aerial vehicle and the remote controller;
- selecting, based on the available bandwidth, a wireless interface for transferring a data packet to the remote controller, the wireless interface selected between a TCP interface and a UDP interface; and
- transferring the sensor data from the buffer to the remote controller via the wireless interface.

17. The non-transitory computer readable storage medium of claim 16, wherein the instructions when executed further cause the processor to perform steps including:
- responsive to detecting that the available bandwidth exceeds a first threshold, transferring the data packet in duplicate over both the TCP interface and the UDP interface.

18. The non-transitory computer readable storage medium of claim 16, wherein the instructions when executed further cause the processor to perform steps including:
- responsive to detecting that the available bandwidth does not exceed a first threshold, transferring the data packet over the UDP interface only.

19. The non-transitory computer readable storage medium of claim 12, wherein the instructions when executed further cause the processor to perform steps including:
- synchronizing a local clock of the unmanned aerial vehicle; and
- timestamping the sensor data using the local clock when storing the sensor data to the buffer.

20. An unmanned aerial vehicle system comprising:
- a processor; and
- a non-transitory computer readable storage medium storing instructions for managing data in the unmanned aerial vehicle system, the instructions when executed by a processor causing the processor to perform steps including:
  - capturing sensor data from sensors on the unmanned aerial vehicle system;
  - transferring the sensor data from the unmanned aerial vehicle system to a remote controller via a wireless interface;
  - responsive to detecting a loss of a link to the remote controller, storing the sensor data to a buffer and monitoring a flight status of the unmanned aerial vehicle system, the flight status indicating whether the unmanned aerial vehicle system is in motion; and
  - responsive to detecting that the unmanned aerial vehicle system is stationary following the loss of the link, transferring the sensor data from the buffer to a non-volatile storage.

* * * * *